United States Patent
Chen et al.

(10) Patent No.: US 7,133,551 B2
(45) Date of Patent: Nov. 7, 2006

(54) SEMI-AUTOMATIC RECONSTRUCTION METHOD OF 3-D BUILDING MODELS USING BUILDING OUTLINE SEGMENTS

(75) Inventors: Liang-Chien Chen, Tao-Yuan (TW); Jiann-Yeou Rau, Tao-Yuan (TW)

(73) Assignee: National Central University, Taoyuan Hsien (TW)

( * ) Notice: Subject to any disclaimer, the term of this patent is extended or adjusted under 35 U.S.C. 154(b) by 629 days.

(21) Appl. No.: 10/160,814

(22) Filed: May 31, 2002

(65) Prior Publication Data
US 2003/0147553 A1 Aug. 7, 2003

(30) Foreign Application Priority Data
Feb. 7, 2002 (TW) ............................... 91102169 A

(51) Int. Cl.
*G06K 9/00* (2006.01)
*G06K 9/36* (2006.01)
(52) U.S. Cl. ...................... 382/154; 382/285; 345/419; 356/12; 348/42; 359/462
(58) Field of Classification Search ................ 382/154, 382/285; 345/419–427; 356/12–14; 348/42–60; 359/462–477; 352/57–65; 33/20.4; 353/7–9; 378/41–42; 396/324–331
See application file for complete search history.

(56) References Cited

OTHER PUBLICATIONS

"On The Performance of Semi-Automatic Building Extraction" Eberhard Gulch, Hardo Muller, Thomas Labe, and Lemonia Ragia / Institute of Photogrammetry University Bonn, Germany / Commission III, Working Group 4.

"CC-Modeler: A Topology Generator for 3-D City Models" Armin Gruen and Xinhua Wang / ISPRS Journal of Photogrammetry & Remote Sensing 53 (1998) / p. 286-295.

"The Role of Color Attributes and Siminarity Grouping in 3-D Building Reconstruction" Olof Henricsson / Computer Vision and Image Understanding vol. 72. No. 2. Nov., 1998 / Article No. IV980718 / p. 163-184.

*Primary Examiner*—Bhavesh M. Mehta
*Assistant Examiner*—Aaron Carter
(74) *Attorney, Agent, or Firm*—J.C. Patents

(57) ABSTRACT

A semi-automatic reconstruction method of 3-D building models using building outline segments is introduced. The core technology of the present invention is called the "Split-Merge-Shape" algorithm. The Split and Merge processes sequentially reconstruct the topology between any roof-edges of the buildings and then reform them as enclosed regions. The Shape process uses height information and consecutive-coplanar analysis to determine the shapes and heights of the roofs. After generating polyhedral building models, prismatic building models can also be generated by using a semi-automatic procedure. An existing digital topographic map of buildings can be directly used to reconstruct their 3-D models without any excess stereo-measurements. In addition to cost reduction, high efficiency, high quality, and minimization of manual operations, the integration of photogrammetric mapping with 3-D building modeling in one procedure is possible, which is the most cost-effective approach for 3-D mapping.

9 Claims, 40 Drawing Sheets
(33 of 40 Drawing Sheet(s) Filed in Color)

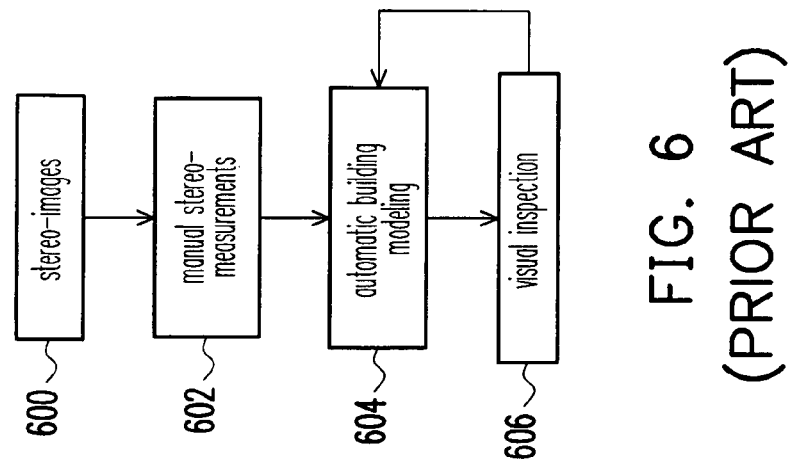
FIG. 6 (PRIOR ART)
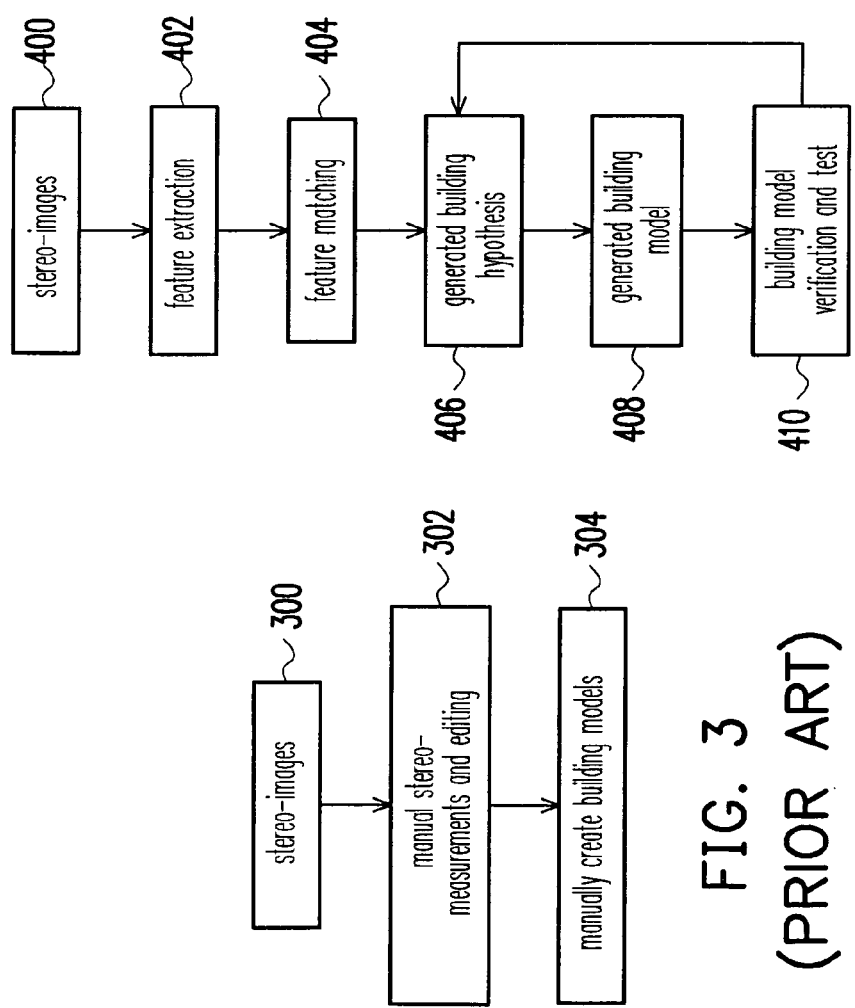
FIG. 4 (PRIOR ART)
FIG. 3 (PRIOR ART)

(PRIOR ART)　(PRIOR ART)　(PRIOR ART)

SEMI-AUTOMATIC RECONSTRUCTION METHOD OF 3-D BUILDING MODELS USING BUILDING OUTLINE SEGMENTS

CROSS-REFERENCE TO RELATED APPLICATION

This application claims the priority benefit of Taiwan application serial no. 91102169, filed Feb. 7, 2002.

BACKGROUND OF THE INVENTION

1. Field of the Invention

The present invention relates generally to a semi-automatic technique that can reconstruct 3-D building models by using building outline segments, specifically, a technique that can establish the topology between separated line segments. The present invention further relates to a technique for performing 3-D mapping by integrating the digital photogrammetric mapping with 3-D building model reconstruction. The range of application for the generated 3-D building model is very broad. In addition to urban planning, it is useful for cellular phone station setups, flight simulations, virtual reality, noise or air pollution simulations, environmental impact evaluations, environmental monitoring, change detection, and various other 3-D geographical information applications.

2. Description of the Related Art

In digital photogrammetric mapping, a digital photogrammetric system and digital aerial stereo-images (FIG. 1) are used to perform manual stereo-measurement on ground objects. The delineation of building outlines is performed by the measurement of each corner points. Two consecutive measurements form a building outline segment. If a building's corner is occluded, then manual inference or on-site surveying is necessary to complete the measurement of occluded corner. Finally, in the produced topographic map, the height about the building is denoted by number of stories. The whole procedure is very laborious, time consuming, and costly On the other hand, in the generation of 3-D building models, it is also performed manually on a digital photogrammetric system using aerial stereo-images. FIG. 3 illustrates an abstract flow chart of a fully manual 3-D building model reconstruction. In step 300, the aerial stereo-images with known orientation parameters are used. In step 302, the building corners are manually measured by stereo-measurements. When the occlusion of the building corner occurs, manual inference or on-site surveying is necessary to complete the measurement of occluded corner. Finally, in step 304, manually structuring is performed on the measurements and the topology is thus established to construct the 3-D building model. Due to manually stereo-measurement errors, it always causes topologic errors at neighboring buildings and thus excess manual editing is necessary to deal with the connection problems. The whole procedure is also very laborious, time consuming and costly.

In heavily developed cities, the buildings are constructed with a very high density in a continuous morphology. This will introduce serious occlusion problems between neighboring buildings. When establishing the topology between two neighboring buildings, topologic errors are easily made due to manual measurement errors. Therefore, a significant amount of labor and cost will incur when the above fully manual reconstruction procedure is utilized.

One can realized that the above digital photogrammetric mapping and manual 3-D building model reconstruction have one common procedure. That is the manual stereo-measurements. Despite of the inevitable time spent on manual stereo-measurements, the majority of the workload is spent on the subsequent manual editing of the topomap and manual structuring of the building models. The purpose of the present invention is to reduce the workload of these manual operations, such as the manual stereo-measurements, manual editing of buildings in photogrammetric mapping, and the manual structuring of building models.

The relevant literatures with respect to 3-D building model reconstruction can be categorized into the fully automatic and the semi-automatic strategies. Their purpose is also aimed at reducing the workload of an operator and thus to reduce the production cost.

In heavily developed cities, buildings are densely constructed in a continuous morphology. Accordingly, serious occlusion problems between neighboring buildings are resulted. When establishing the topology between two neighboring buildings, topologic errors are easily made due to manual measurement errors. Therefore, a significant amount of labor and cost will incur when the above fully manual reconstruction procedure is utilized.

FIG. 4 illustrates an abstract flow chart of a fully automatic strategy. In step 400, aerial stereo-images with known orientation parameters are utilized. In steps 402 and 404, the feature extraction and feature matching are performed, respectively, to obtain roof-edges or building corners information. In steps 406, 408, and 410, a building model hypothesis was further generated, tested, and verified, respectively The final 3-D building model may thus be obtained.

For example, Fischer et al. (1998) start from feature extraction and feature matching using multi-view stereo-images. The 3-D building corners and roof-edges are derived and inferred as building parts. A building hypothesis was then generated and verified by mutual interactions between the 2-D and 3-D processes. Henrisson (1998) also starts from image feature extraction and matching, to obtain 3-D building outline segments. Color attributes along the extracted line segments are calculated and applied for similarity grouping, and then incorporating into coplanar grouping to infer a 3-D building model.

The above two authors use automatic image matching technique to obtain 3-D information. In high-resolution aerial stereo-images, mismatching may happened due to ambiguity problems, building occlusion problems, shadow effects, and poor image quality. All can result in incorrect or incomplete 3-D information, which will further affect the reliability and accuracy of the generated building models. As shown in FIG. 5, the difference in the areas of frames 500 and 502 is small, but is easy and differentiable by the human eye. However, in an automatic image matching process it relies on the features within the frames. Those areas with similar image feature may introduce incorrect matching results. That is the reason why a fully automatic strategy has not been applicable up to date.

On the other hand, the semi-automatic strategy is also adopted in various approaches. Some of them follow the flow chart as shown in FIG. 6. In step 600, aerial images with known orientation parameters are utilized. In step 602, manual stereo-measurements are performed. In step 604, an automatic building model reconstruction is performed. In step 606, manual visual inspections are performed to complete the modeling. Gülch et al. (Gülch, E., H. Muller, T. Läbe & L. Ragia, 1998. On the performance of semi-automatic building extraction, *Proceedings of ISPRS Commission III Symposium*, Columbus, Ohio, Jul. 6–10, 1998)

and Grün & Wang (Gün, A. and X. Wang, 1998, CC-Modeler: A Topology Generator for 3-D Building Models, *IJPRS*, Vol. 53, pp. 286–295.) are two examples of this approach. Commercial software that applies the techniques proposed in the above two approaches has already been released up to date.

In contrast to point-based measurement in traditional photogrammetry, Gülch et al. (1998) proposed a building primitive-based measurement. In their approach, the operator is responsible for choosing an appropriate building primitive, which is selected from a predefined building model database. In the modeling phase, the selected building primitive was back-project onto one aerial image (as shown in FIG. 7*a*) via monoscopic viewing, as shown by the wire-frame model in FIG. 7*b*. The operator has to adjust the wire-frame model to fit the corresponding building boundary (as shown in FIG. 7*c*) by using three possible strategies: (1) a purely manual adaption, (2) a guided adaption, or (3) an automated adaption. A complex building is decomposed into some basic building types and constructed using a Constructive Solid Geometry (CSG) tree. The operator is also responsible for handling the CSG tree structures. Although the approach is innovative, the operator takes too heavy responsibility, necessitating a qualified operator. The approach may be efficient for simple structure and specific type of building, but not for a complex structure building and a group of connected buildings especially in densely built-up areas where occlusions and shadows frequently occur.

The above two authors use automatic image matching technique to obtain 3-D information. In high-resolution aerial stereo-images, mismatching may happen due to ambiguity problems, building occlusion problems, shadow effects, and poor image quality. All can result in incorrect or incomplete 3-D information, which will further affect the reliability and accuracy of the generated building models. As shown in FIG. 5, the difference in the areas of frames 500 and 502 is small, but is easy and differentiable by the human eye. However, in an automatic image matching process it relies on the features within the frames. Those areas with similar image feature may introduce incorrect matching results. That is the reason why a fully automatic strategy has not been applicable up to date.

SUMMARY OF THE INVENTION

The present invention uses building outline segments for 3-D building model reconstruction based on a semi-automatic approach. So far the manual stereo-measurement is still the most reliable and accurate way to obtain the basic 3-D information of building outlines. Gratefully, in our approach the occluded building corners do not have to be determined during the manual measurements. That is, only the both visible part of roof-edges on the stereo-images is necessary to be measured. Since the inference of occluded corners can be avoided, the operator's job is thus simplified. Meanwhile, an automatic structuring process is invented to avoid the necessity for manual modification and modeling. The operator's workload is thus dramatically reduced, and the production cost is further decreased.

The method of the invention for 3-D building model reconstruction includes six major steps. In addition to the measurements of building outline segments: initialization and pre-processing, splitting, merging, shaping, and visual inspection are included. In the present approach, a roof-primitive is defined as a part or a complete building. Each roof-primitive is a planar rooftop, (e.g. a horizontal or oblique plane), with its boundary projected onto the ground as a polygon. One roof-primitive, or a combination of roof-primitives, can be reformed as a polyhedral building model. The used building outline segments can be complete or incomplete roof-edges In which, the topology relationships between all roof-edges are not established. That is, the method is tolerant of partial-occluded roof-edges caused by hidden corners that were not inferred or measured. The splitting and merging steps are the two main procedures for topology reconstruction from those building outline segments. The shaping step uses the available roof-edge height information to infer an appropriate rooftop. Visual inspection and post-processing is necessary to assure the quality of results. With the invent Split-Merge-Shaping (SMS) technique, the photogrammetric mapping of buildings, and geometrical building modeling, can be seamlessly integrated into a unified procedure. Accordingly, a technique similar to the SMS technique is invented to generate prismatic building models from existing polyhedral building models. The generalization of prismatic models includes three semi-automatic procedures, called (1) selection, (2) merging, and (3) shaping. Detailed descriptions of the above procedures for building modeling are stated as follows 1. Building Outline Segments Measurement In the following demonstration the building outline segments are manually measured from an aerial stereo pair using a Digital Photogrammtric Workstation (DPW). However, other data sources like automatic feature extraction or on-site ground surveying are also applicable. When a DPW is utilized, the measuring sequence of building outline segments is free from order. For partial-occluded roof-edges, the delineation can be made on the visible part only.

2. Initialization and Data Pre-processing

The key for the realization of the whole idea is to create an initial building model or an Area Of Interest (AOI). The initial building model is the first roof-primitive with a known topology. It is simply built in such a way that an operator needs only to specify the AOI with a polygonal boundary. By the incorporation of a reasonable height, a volumetric representation of the initial building model, which selects a group of building outline segments in one process.

The present invention uses building outline segments for 3-D building model reconstruction based on a semi-automatic approach. So far the manual stereo-measurement is still the most reliable and accurate way to obtain the basic 3-D information of building outlines. Gratefully, in our approach the occluded building corners do not have to be determined during the manual measurements. That is, only the visible part of roof-edges on the stereo-images is necessary to be measured. Since the inference of occluded corners can be avoided, the operator's job is thus simplified. Meanwhile, an automatic structuring process is invented to avoid the necessity for manual modification and modeling. The operator's workload is thus dramatically reduced, and the production cost is further decreased.

The collinear processing is used to adjust the line parameters, i.e. the slope and intercept, using a pipeline Those line-segments that were covered by a pipeline are regarded as collinear. The pipe-width is related to the accuracy of the manual measurements and the spatial resolution of the aerial images The orthogonal processing is performed on the 2-D horizontal plane, in which two perpendicular principal-axes are estimated from all processed line-segments by means of an auto-clustering technique. Note that the orthogonal processing should only be applied to those buildings with a naturally perpendicular structure. A threshold of boundary skewness is given to determine whether the buildings to be processed are orthogonal. This is to avoid incorrect building shape changes, especially for buildings with curvy boundary. Only line-segments skewed less than the designated threshold will be adjusted as described.

The dangle removal processing is performed on the 2-D horizontal plane. A dangle refers to a line terminal that is suspended, not connected to any other line-segments. Due to measurement errors, two line-segments may intersect by overshooting and introduce dangles. These dangles will be considered as a kind of line-segment but will produce illegal building outlines. In dangle removal processing, we remove them by changing the coordinates of the line terminals to the intersection position.

Due to building occlusions and only the visible part of partial-occluded roof-edges are measured, the partial-occluded roof-edge will also regarded as a dangle. Since the objects to be treated are the buildings or objects that are in a form of closed polygon. The dangle snapping process can extend such a roof-edge until a wall is reached, to form an enclosed building outline on the 2-D horizontal plane. In case an oblique roof-edge is extended, its roof-slope should also be maintained.

3. The SPLIT Step

This process is worked on the 2-D horizontal plane. In splitting, one line-segment is chosen as a reference. If any roof-primitives contain this line-segment, we SPLIT them into two. For example, the initial building model will be split into two roof-primitives using any line-segment inside the AOI. The splitting action is similar to the manual inference of hidden corners. For successive line-segments, a combination of the possible roof-primitives (building models) is constructed. The sequence of splitting is free from constraints. The result of splitting will be different when different sequence of line-segments is applied. However, after the next Merge step the result of topology reconstruction will be identical.

4. The MERGE Step

This procedure is also worked on the 2-D horizontal plane. Since the initial building model is only a virtual shell that will enclose all the building outline segments, those roof-primitives that connected to the initial building model are removed at first. Then, every two connected roof-primitives are analyzed successively. If the shared boundary between them does not correspond to any building outline segments, the two roof-primitives will be merged into one. The rationality check is performed on each roof-primitive further That is, if any roof-edge of a roof-primitive does not have any corresponding building outline segment, the roof-primitive will be removed, too. This situation often occurs near the outer-most part of the processed buildings group, where there is no neighbored roof-primitive for merging analysis.

5. The SHAPE Step

This process is worked on the 3-D object space via the following two sub-steps: The first sub-step is to assign a possible height for each roof-edge from its corresponding building outline segments. When two roof-primitives share a common boundary, i.e. shared edge, the height of the roof-edge cannot be assigned directly, because there may exist a hidden roof-edge with a lower height. Therefore, every roof-edge is automatically labeled as a shared edge or an independent-edge at first. The height for an independent-edge can be assigned and fixed from its corresponding building outline segment. Notice that the height is not fixed for shared edges up to this stage.

The second sub-step is to infer the shape of a rooftop iteratively, according to the height of the independent-edges. If only one independent-edge is found for a roof-primitive, it is necessary to check whether its surrounding rooftops are all fixed or not. If they are fixed and higher, then such a rooftop can be inferred from the independent-edge. If more than two independent-edges exist and are sufficient to fit into a planar roof patch, then the least-squares coplanar fitting can be applied to calculate the heights for all roof corners. Otherwise, the system will provide the most possible solution by the consecutive-coplanar analysis. Two consecutive building outline segments are always coplanar, but occasionally two non-consecutive independent roof-edges may also be coplanar. So consecutive-coplanar analysis is developed to find all possible planar rooftops from those consecutive line-segments or any two non-consecutive but coplanar ones.

6. Visual Inspections and Post-processing

Due to the diversity of building types and measurement errors or mistakes, the invent method may encounter shaping errors and topology errors. Since two consecutive line-segments can define a possible planar rooftop, the solution is not unique when the delineation of a rooftop is not coplanar. One can visually inspect every generated roof-primitive. If shaping errors happened, the post-processing procedure provides the operator with the capability to easily select the best-fitting rooftop out of all possible rooftops provided by the consecutive-coplanar analysis as described previously. If topology errors occurred, the operator may need to correct measurement mistakes or performing pre-processing, i.e. collinear processing, dangle snapping, or dangle removal, to get error-free results.

7. Generation of Prismatic Building Models

The manual measurement of building outlines along the roof-edges will cause a rooftop to be oblique or flat. Incorporating with the present technique describe above will result in polyhedral building models. Such a polyhedral building model provides the most realistic scenario of a city. For such kind of model, a complex structured building may be decomposed into many roof-primitives that their roof height and planarity are different. On the other hand, in many of the current geographic information applications that prismatic building model is utilized. The prismatic models can describe complex buildings with flat roofs, with polygonal ground plans, and with vertical walls That is, the prismatic building model is a generalized form of the polyhedral model. Therefore, we develop a technique similar to the Split-Merge-Shape algorithm to construct the prismatic building model after the polyhedral building model is established. The process includes the following steps:

1. The Select Step: Considering ownership, the operator manually selects the neighboring roof-primitives that belong to the same owner. Since the selection of roof-primitives that belong to the same owner needs to be correct, an operator needs to have a priori information about the ownership. Cadastral maps, for instance, are needed when ownership is considered.

2. The Merge Step: After selection, those roof-primitives that belonging to the same owner are merged into one roof-primitive, using a technique similar to the SMS Merge step. The major difference is that the shared boundaries should be totally removed.

3. The Shape Step: After merging, the system provides an estimation of the possible flat-roof height. The height estimation is designed to find the lowest height for the greatest area. However, this may not meet the photogrammetric mapping protocol, since such estimation may influence the calculation of the number of stories. In case the estimated flat-roof height is not correct, the operator can then change the height iteratively. The provided height values are estimated automatically from the other roof-primitives.

Both the above general description and the following detailed description are exemplary and explanatory only and are not mean to fully define the method.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee

FIG. 3 shows an abstract flow chart of a conventional fully manual approach for 3-D building model reconstruction;

FIG. 4 shows an abstract flow chart of a fully automatic strategy for 3-D building model reconstruction;

FIG. 6 shows an abstract flow chart of one of the semi-automatic 3-D building model reconstruction methods;

DESCRIPTION OF THE PREFERRED EMBODIMENTS

Embodiment 1

Figure 8:
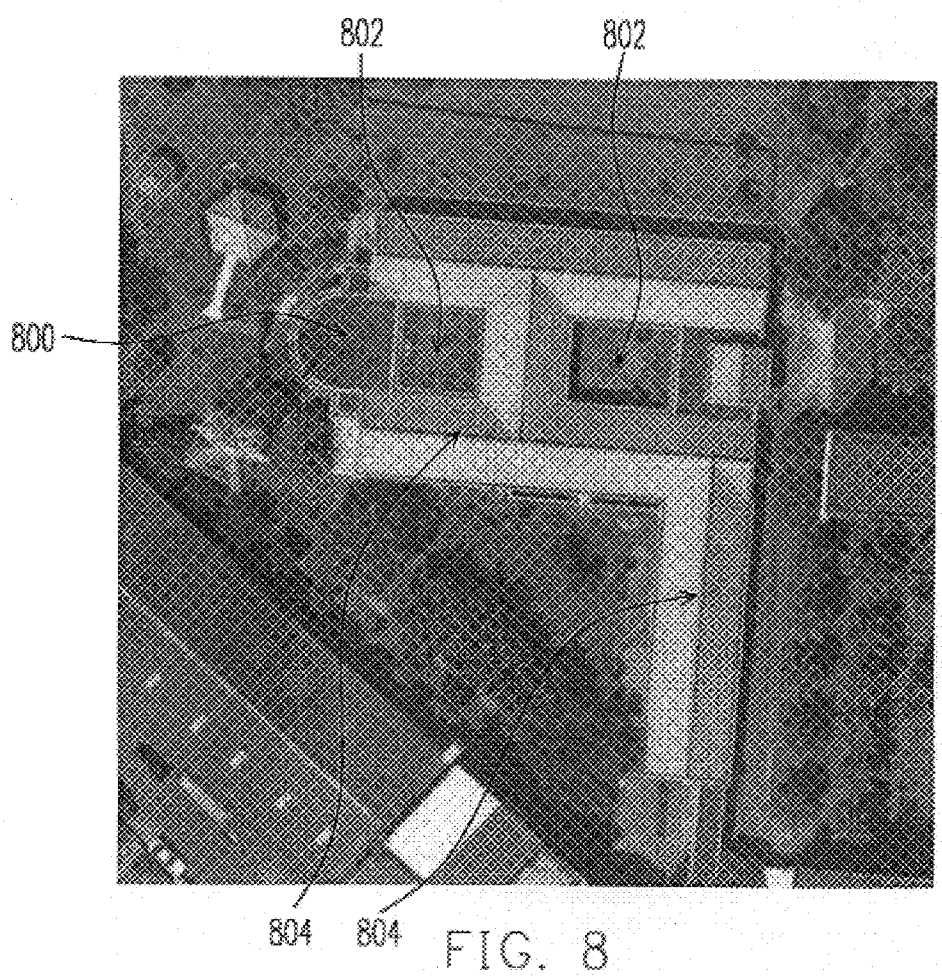
FIG. 8 shows an example of complex building that is a composite of linear-structured hip-roof, flat-roof, gable-roof, and circular-boundary building, according to the invention.

FIG. 8 shows a group of connected buildings with varied and complex structure, including a circular-flat-roof "800", two courtyards "802", and some gable-hip-roofs "804". In a model-based approach of building model reconstruction, this situation may cause failure or difficulty.

Figure 9:
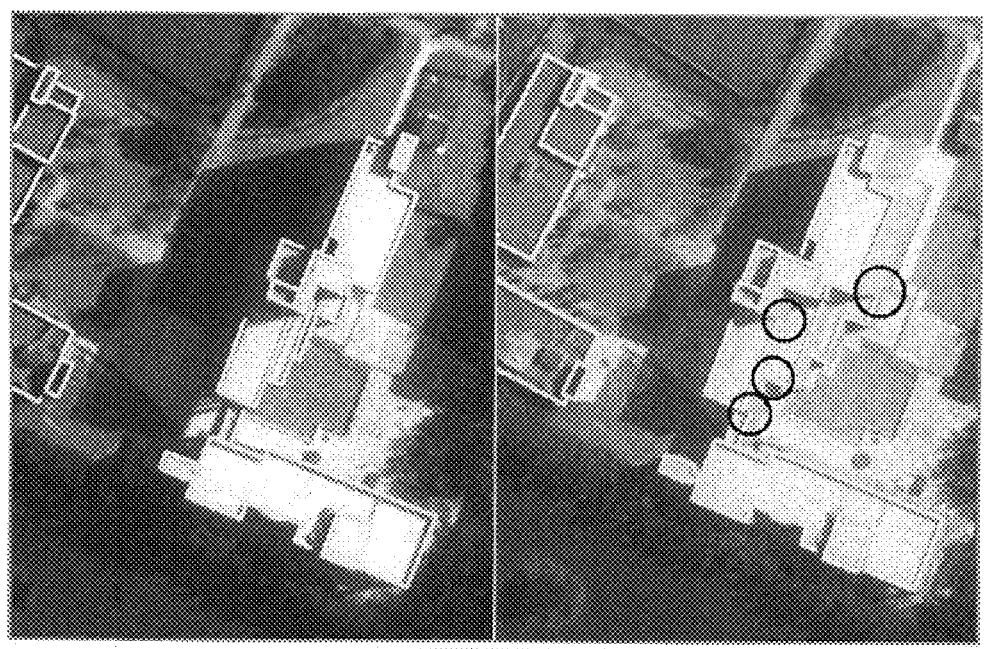
FIG. 9 illustrates the hidden-corner effects happened on the aerial stereo-images, according to the invention.

The aerial stereo-images in FIG. 9 are taken from two different view positions. Certain building corners are observable in one image (such as those in the circled areas on the right-view image in FIG. 9), but may be occluded when another image was taken from a different view position (comparing to those on the left-view image in FIG. 9). In manually stereo-measurements, those hidden corners have to be manually estimated or edited. Such a process will increase the workload especially for densely built-up areas. Additionally, due to manually stereo-measurement errors, it will cause topologic errors at neighboring buildings and excess manual editing is necessary. In the present invention, by ignoring those hidden corners, only the visible-part of the partial-occluded roof-edges is required to measure.

Figure 10:
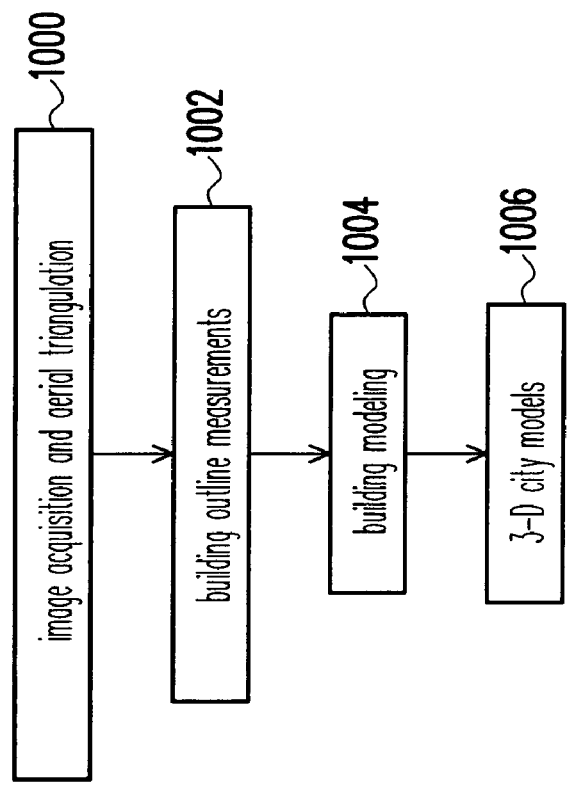
FIG. 10 schematically shows an abstract flow-char of the present method for 3-D building model reconstruction, according to the invention.
Figure 11:
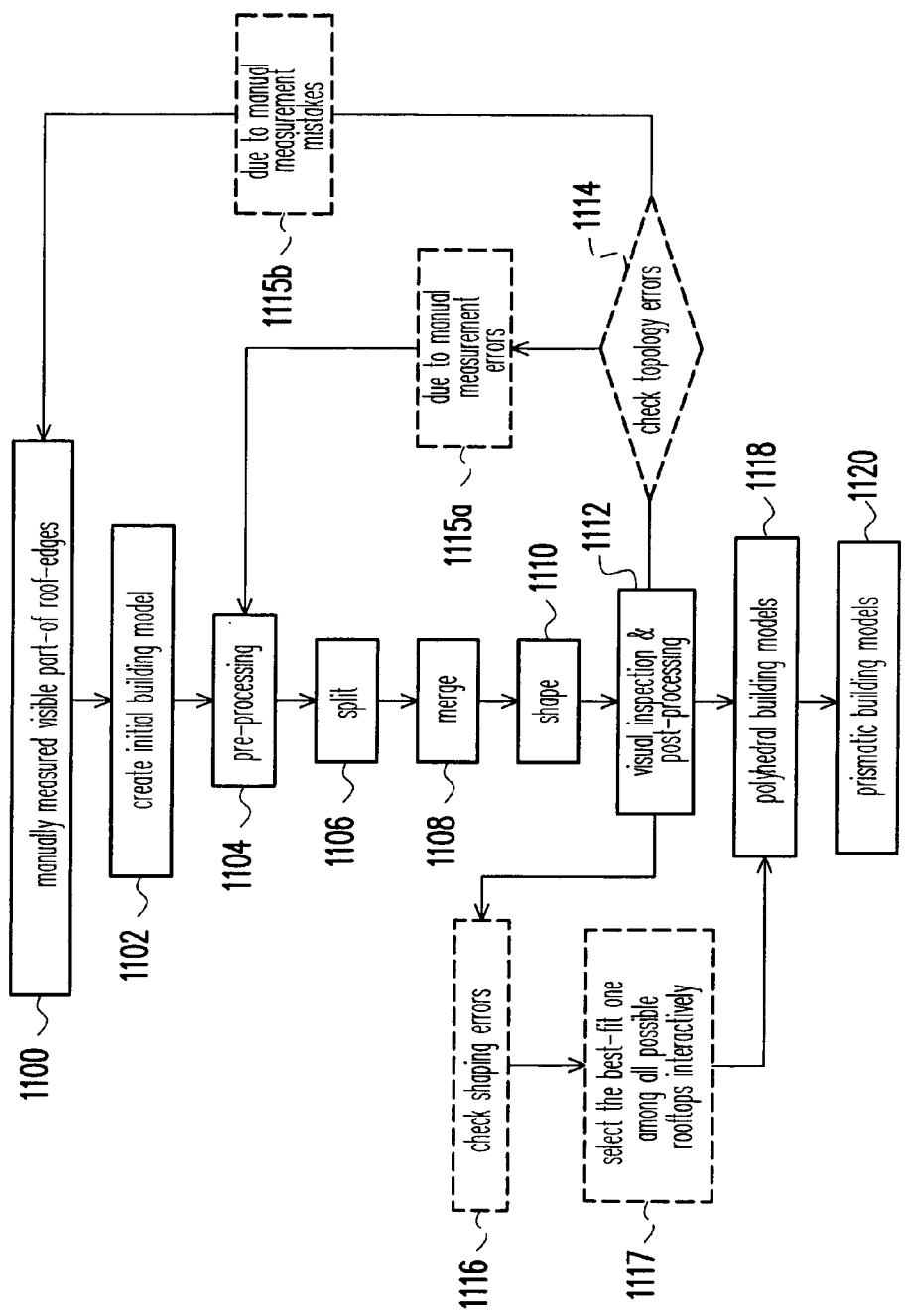
FIG. 11 schematically shows the detailed flow-chart of the present method for 3-D building model reconstruction, according to the invention.
Figure 12A:
FIGS. 12a–12q illustrate the intermediate procedures for constructing a polyhedral building model, according to the present method as shown in FIG. 11, according to the invention.
Figure 12B:
Figure 12D:
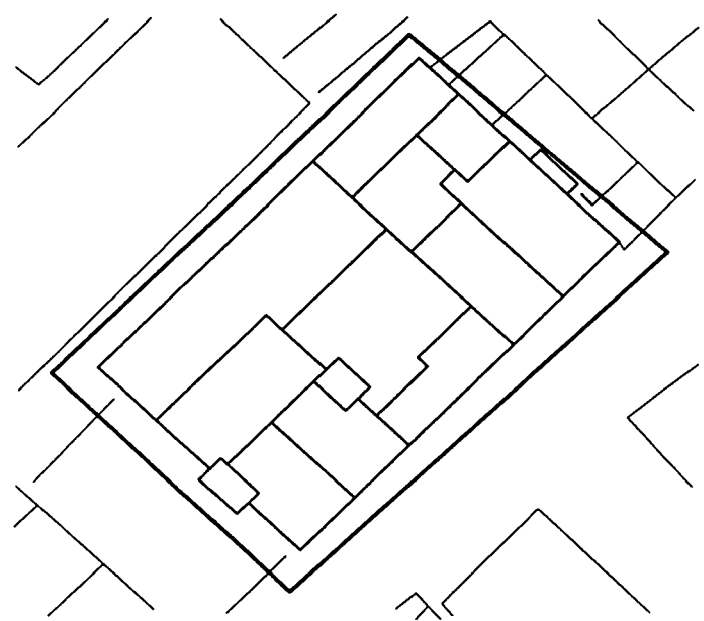
Figure 12C:
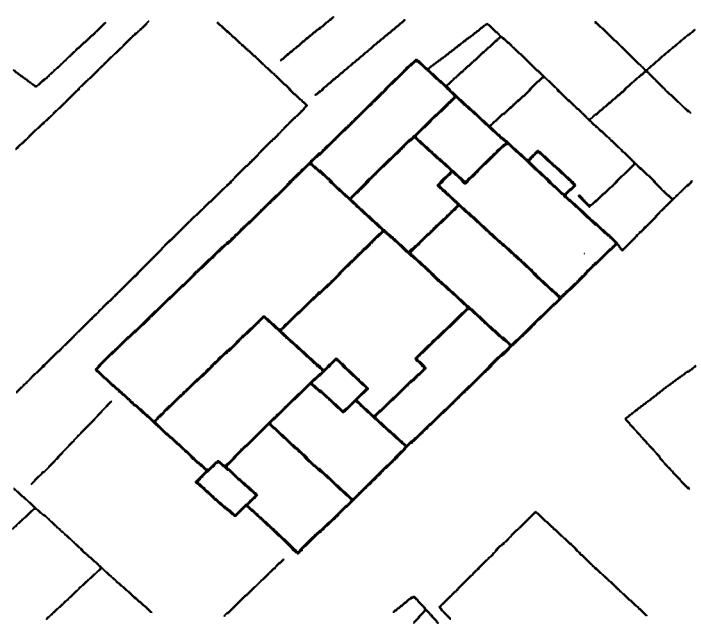
Figure 12E:
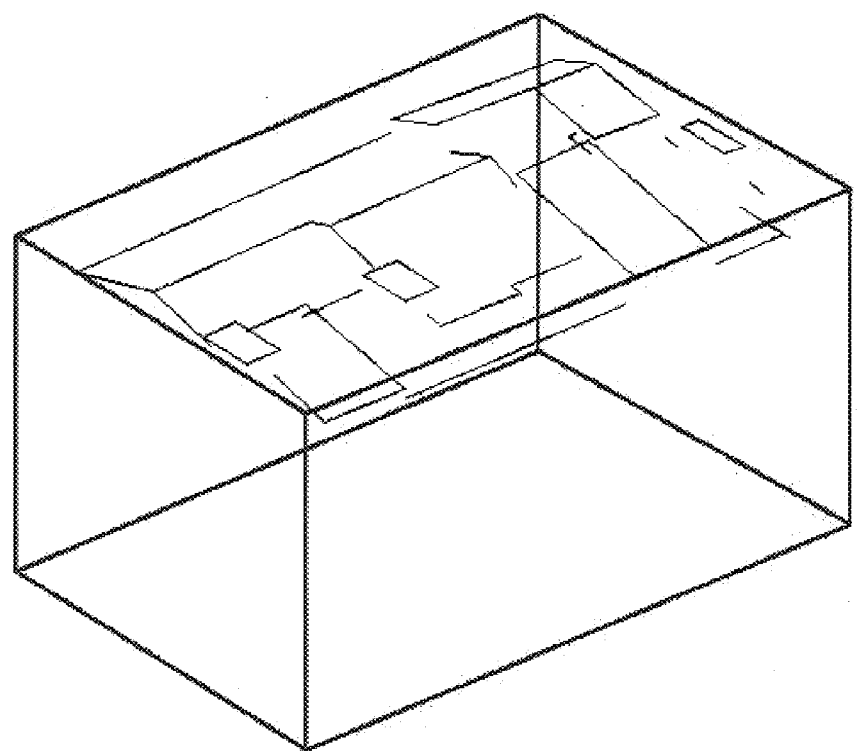
Figure 12F:
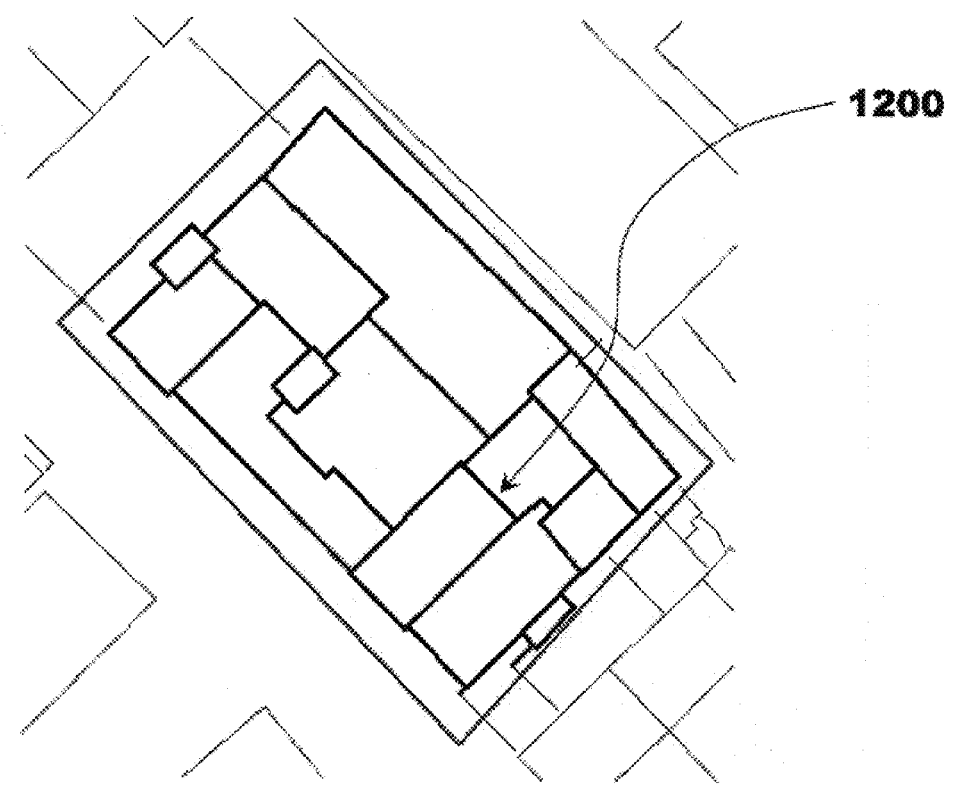
Figure 12G:
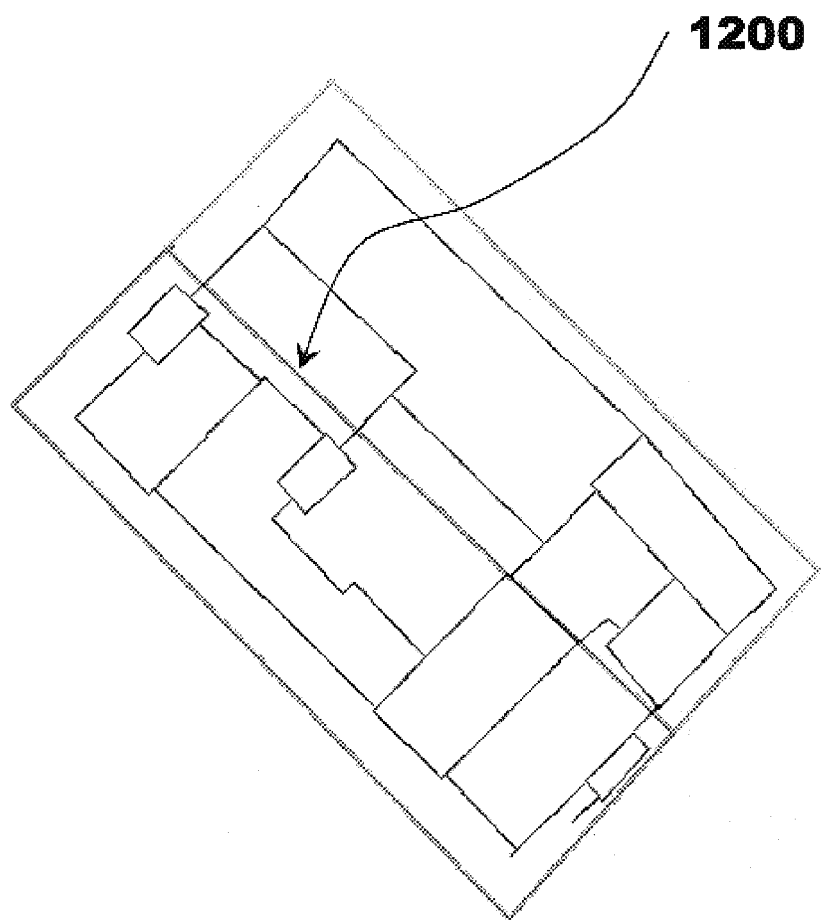
Figure 12H:
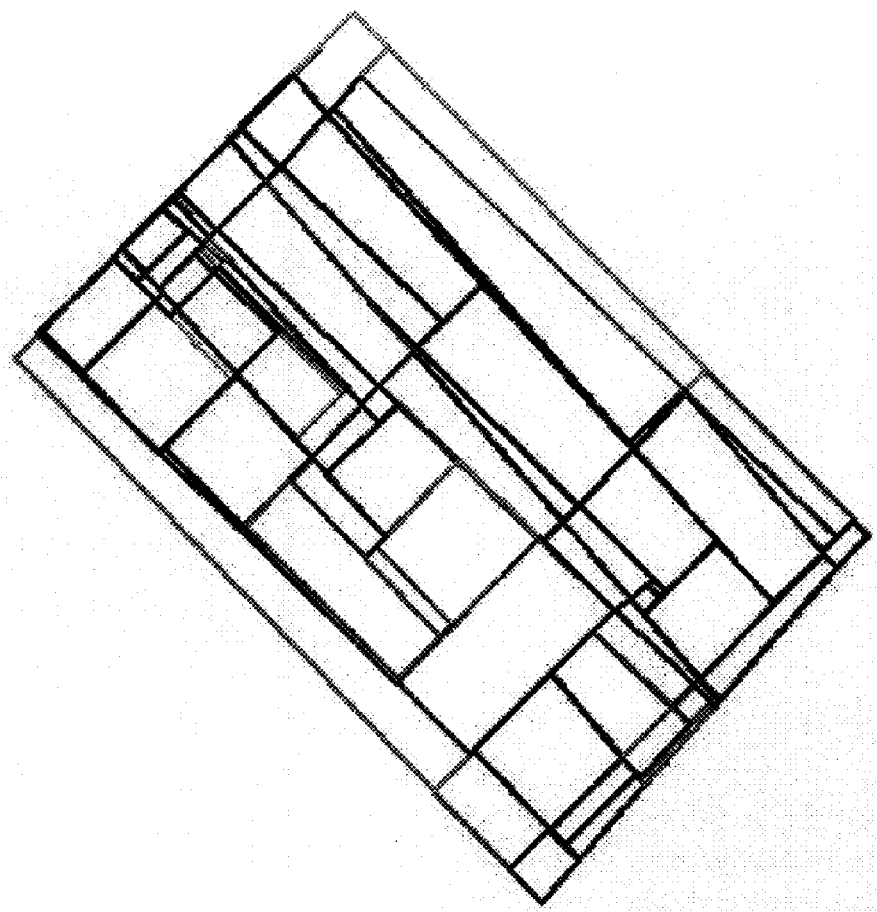
Figure 12I:
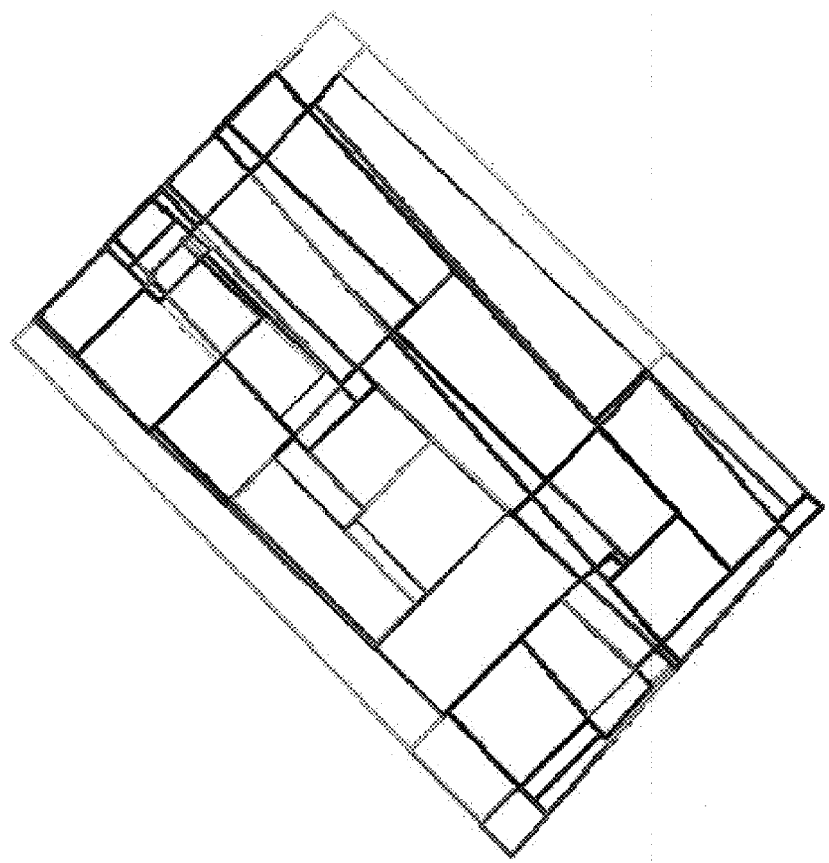
Figure 12J:
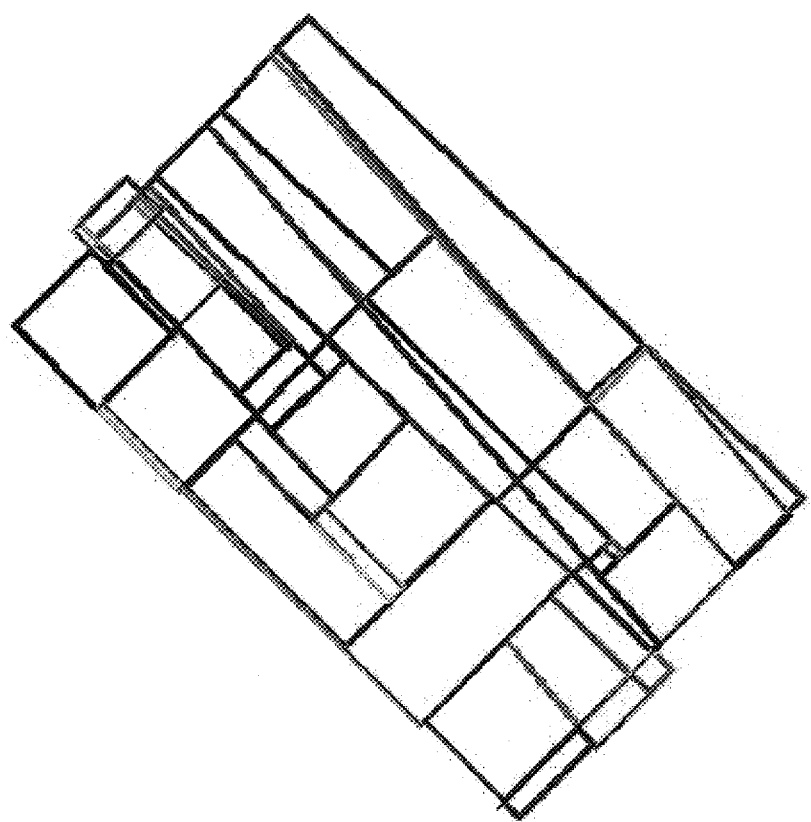
Figure 12K:
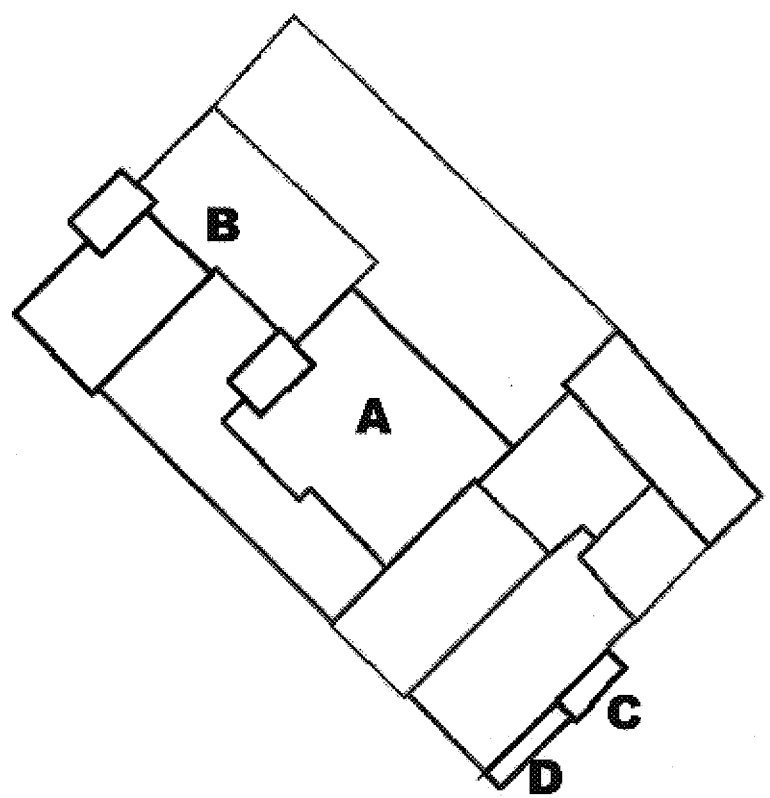
Figure 12I:
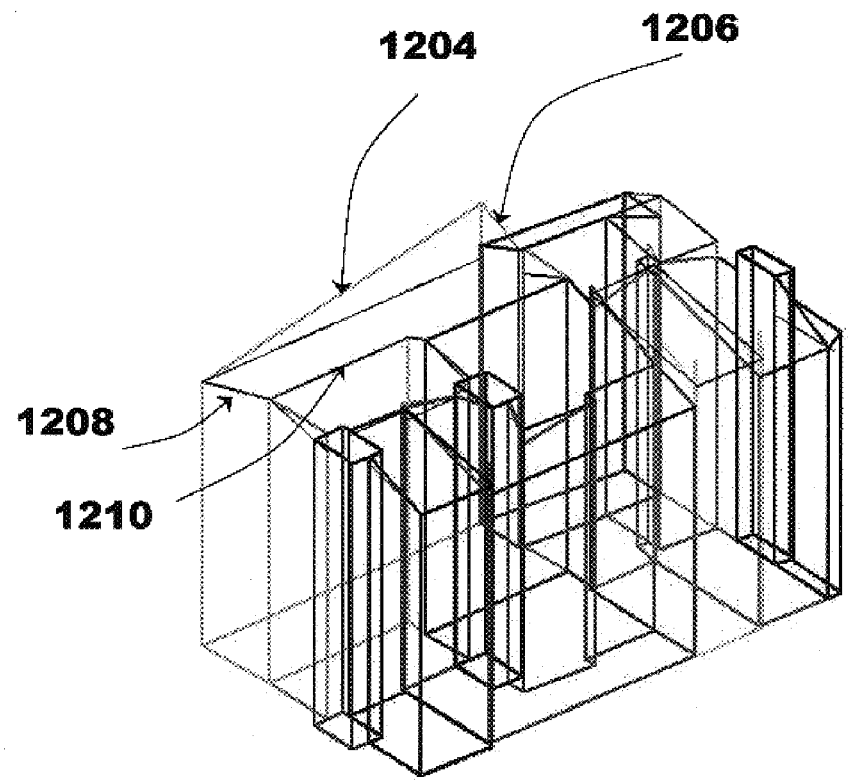
Figure 12I:
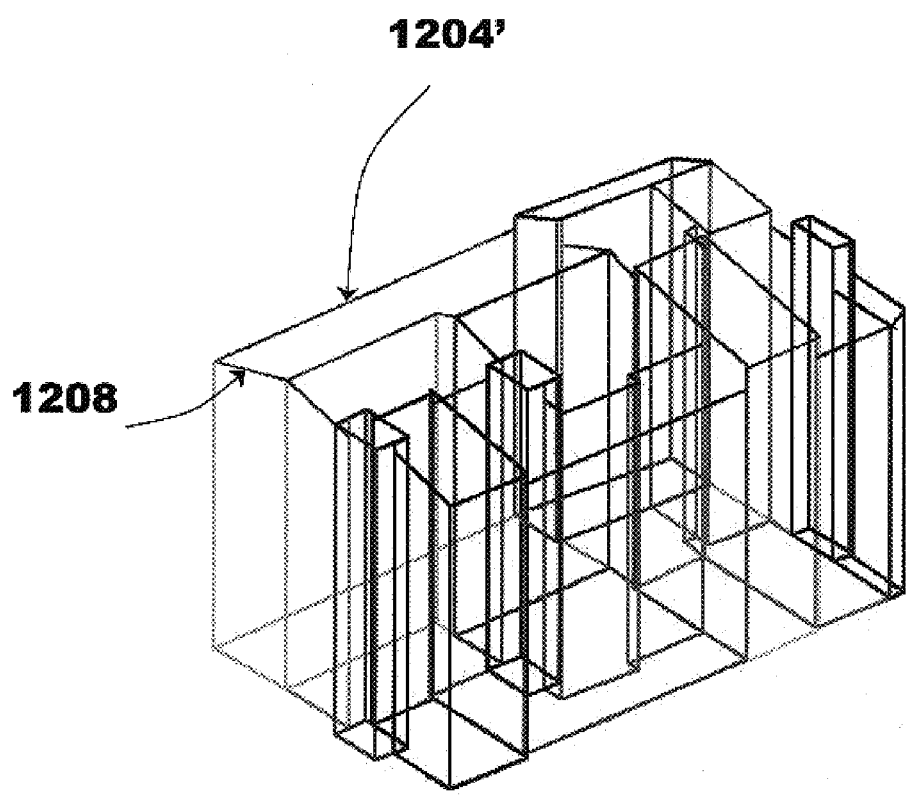
Figure 12M:
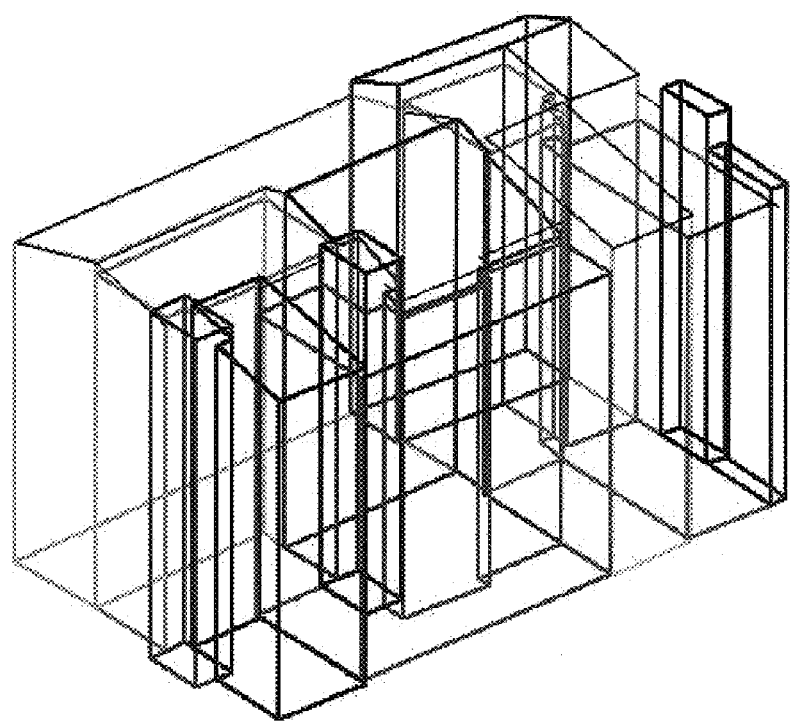
Figure 12N:
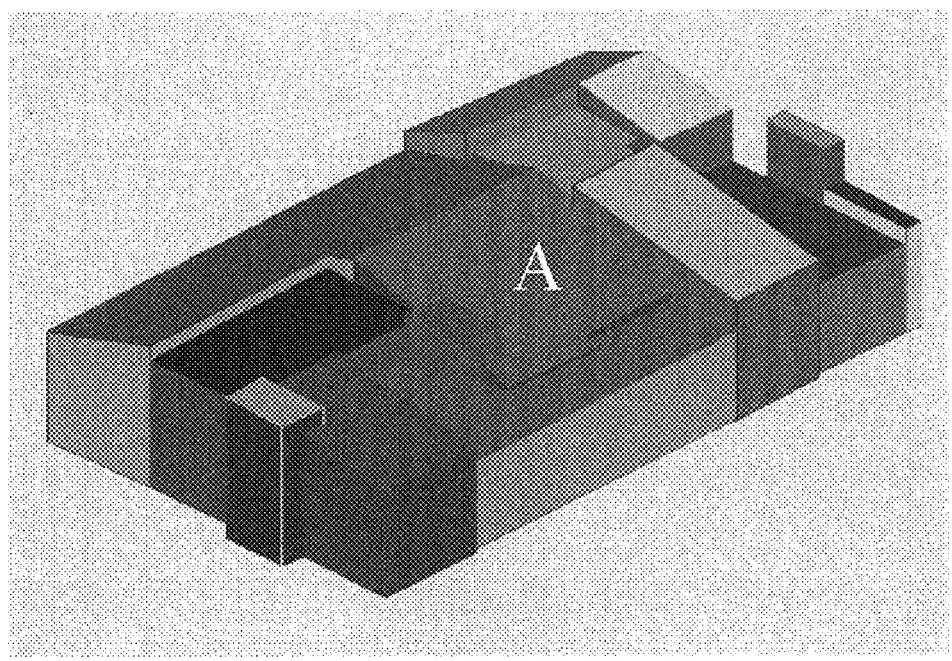
Figure 12O:
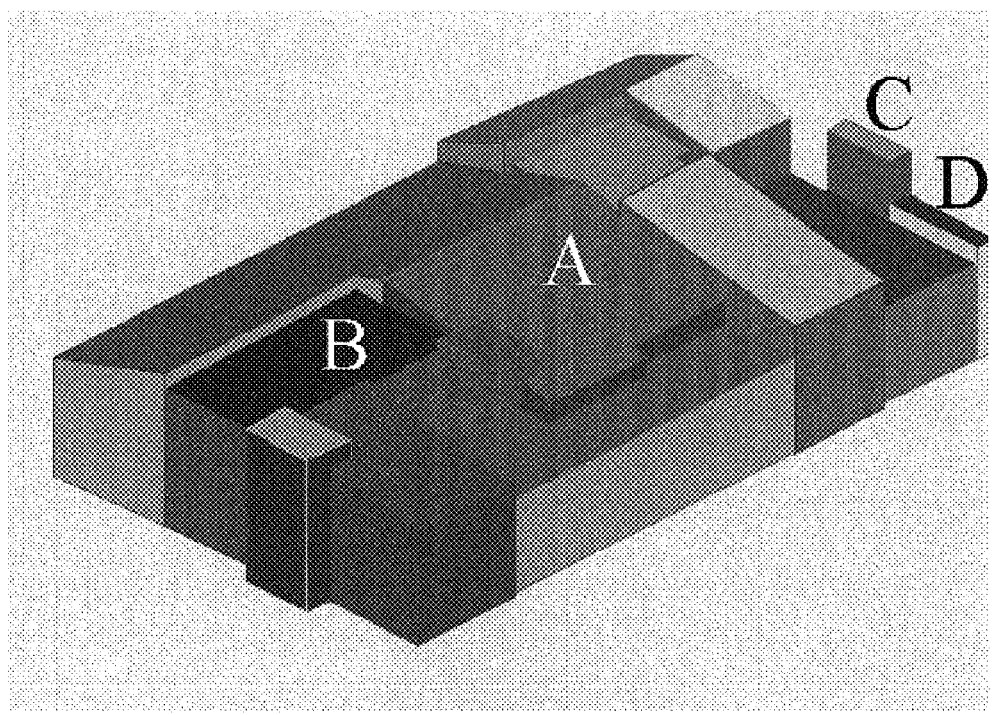
Figure 12P:
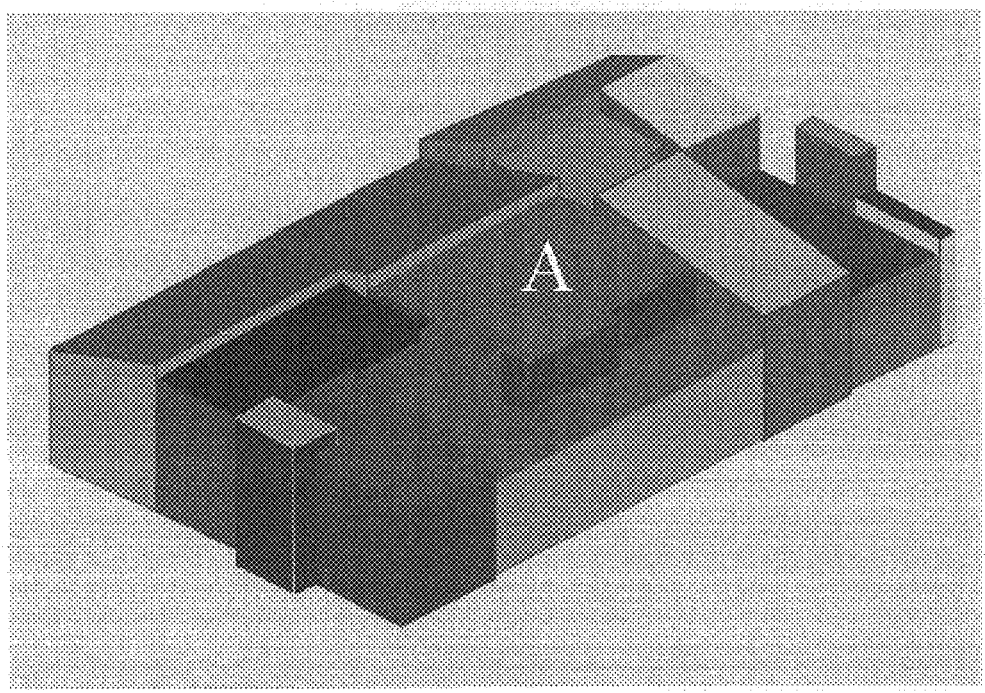
Figure 12Q:
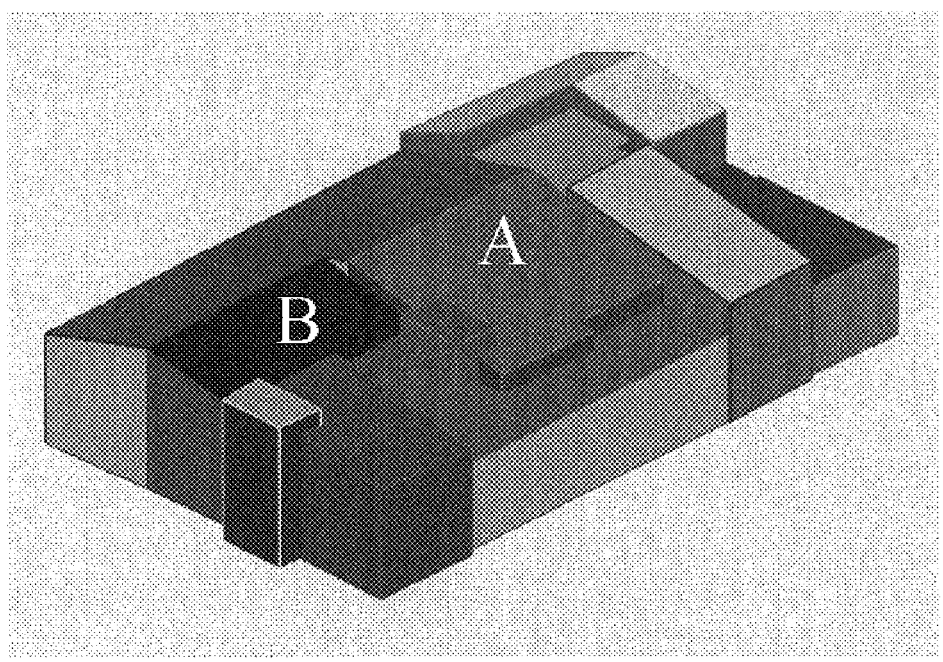

FIG. 10 illustrates an abstract procedure of the present method for constructing building models. In step 1000, the aerial stereo images are acquired and the camera's orientation parameters are calculated at first. In step 1002, the measurement of the building outline segments is performed. In step 1004, the Split-Merge-Shape algorithm is utilized for automatic building modeling. In step 1006, the 3-D building models are thus generated FIG. 11 illustrates the detailed flow-chart of the present method for generating polyhedral and prismatic building models. In the following, a detailed description of the present semi-automatic 3-D building model reconstruction using building outline segments is described. FIGS. 12a to 12q exemplify the detail procedures and the advantages of the present invention.

In FIG. 11, at step 1100, the visible-parts of all roof-edges in both images (as shown in FIG. 12a) are manually measured to obtain the 3-D building outline segments. The measurements are denoted with white line-segments in FIG. 12*b*. Meanwhile, FIG. 12*c* schematically shows those measured building outline segments on a 2-D horizontal plane. In which, the incomplete building outlines are introduced by building occlusion problems.

In step 1004, the building modeling stage includes the creation of an initial building model, pre-processing, and the automatic building modeling. In step 1102, an initial building model is created manually by drawing an Area Of Interest (AOI) on the 2-D horizontal plane. In FIG. 12*d*, the red polygon indicates the initial building model or the AOI on the 2-D horizontal plane, while in FIG. 12*e* it shows those selected working line-segments in 3-D view.

In step 1104, before automatic building modeling, some pre-processing may be necessary to avoid model deformation or modeling failure. The effects of pre-processing will be described further later. As the processed buildings are not in rectangular structure, only the dangle removal, collinear processing, and the dangle snapping are applied. The result is shown in FIG. 12*f*. Comparing to FIG. 12*d*, the incomplete roof-edges have been extended to an end wall and cause enclosure.

In steps 1106, 1108, and 1110, the Split, Merge, and Shape are applied respectively for automatic building modeling. In step 1106, i.e. splitting, choose one line-segment as reference line-segment. If any roof-primitive is overlapped with the reference line-segment, it is split into two roof-primitives. Notice that, the splitting process is performed on the 2-D horizontal plane only. For example, in FIG. 12*f*, line-segment 1200 is used as the reference line-segment to split the initial building model into two possible building models. The results are shown in FIG. 12*g*, in which the building boundary 1202 is the separation of the two generated roof-primitives. FIGS. 12*h* and 12*i* depict the splitting results after applying fifteen and all fifty line-segments, respectively. Finally, the total number of possible roof-primitives generated after splitting is 82.

Since the initial building model is actually non-existent, all roof-primitives that connected to the initial building model are also non-existent. So, after the splitting step those models that connected to the initial building model are removed. As a result, it remains 62 roof-primitives, as shown in FIG. 12*j*.

In step 1108, i.e. the merging step, every two connected roof-primitives are analyzed successively. If the shared boundary between them does not correspond to any building outline segment, then the two roof-primitives will be merged into one. The rationality of each roof-primitive is also checked. If the roof-edge of a roof-primitive does not have any corresponding building outline segment, the roof-primitive will be removed, too. As a result, the number of roof-primitives has been reduced from 62 to 14, as shown in FIG. 12*k*.

In the above split and merge, the topology between the line-segments is reconstructed to form a closed polygonal building boundary It is appreciated that any field of application, for example in the editing of digital topographic map or the editing of polygonal vectors, that uses the Split and Merge technique to reconstruct the topology between line segments can be dealt with by the present method.

FIG. 12*l* shows the generated roof-primitives in 3-D view. Notice that, so far the roof shapes (either flat or oblique) and its real height are still not fixed. Its heights are not matched with the previously measured 3-D building outline segments. One example is shown by the two cyan roof-edges of 1204 and 1206.

In step 1110, the shaping is performed. At beginning, the height of the roof-primitive's boundaries is assigned according to their corresponding 3-D building outline segments, the results are shown in FIG. 121'. According to the consecutive-coplanar analysis, two independent-edges that are coplanar will form a roof patch, such as 1204' and 1208 as shown in FIG. 121'. The shape process is performed iteratively on each roof-primitive by coplanar fitting and consecutive-coplanar analysis. The generated 3-D building models are shown in FIG. 12*m*. One can find out those hidden roof-edges are inferred automatically.

In step 1112, a visual inspection and post-processing is performed to verify the correctness of modeling One referred to the topology correctness of each building boundary (step 1114), the other to the correctness of rooftop shape (step 1116). In step 1114, if the topology errors occur due to manual measurement errors (step 1115*a*), the operator can select an appropriate pre-processing (step 1104) to automatically adjust the original 3-D building outline segments. Occasionally, in step 1114, if the topology errors were occurred due to manual measurement mistakes (step 1115*b*), the operator can perform manual stereo-measurements (step 1100) to correct these mistakes.

In step 1116, if the shape errors occur due to the delineation of roof-edges for a roof-primitive are not coplanar. The present method provides the operator with the capability to select the best-fitted rooftop out of all possible solutions provided by the consecutive-coplanar analysis (step 1117). For example, in FIGS. 12*n*–12*p*, three of many possible roof shapes of roof patch A are demonstrated. After observing and comparing them with the aerial stereo-images, it is found that FIG. 12*p* shows the real shape, which is then selected as the modeling result. Similarly, the roof shape of roof patch B can be determined in the same manner. Meanwhile, roof patches C and D are part-of other buildings at the outside of the AOI, so they can be temporarily removed by other post-processing functions. In step 1118, it finally generates 12 roof-primitives in the form of polyhedral building models, as shown in FIG. 12*q*.

Figure 13A:
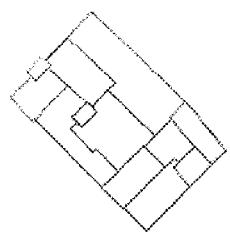
FIGS. 13a–13h illustrate the intermediate procedures for constructing a prismatic building model, according to the present method as shown in FIG. 11, according to the invention.
Figure 13D:
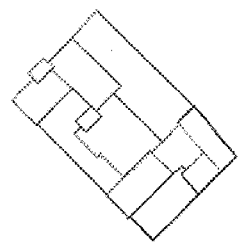
Figure 13B:
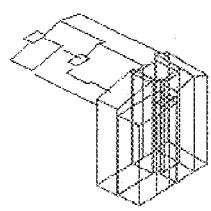
Figure 13E:
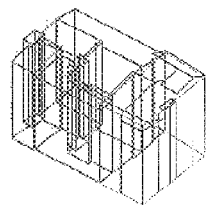
Figure 13C:
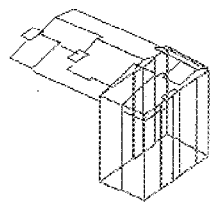
Figure 13G:
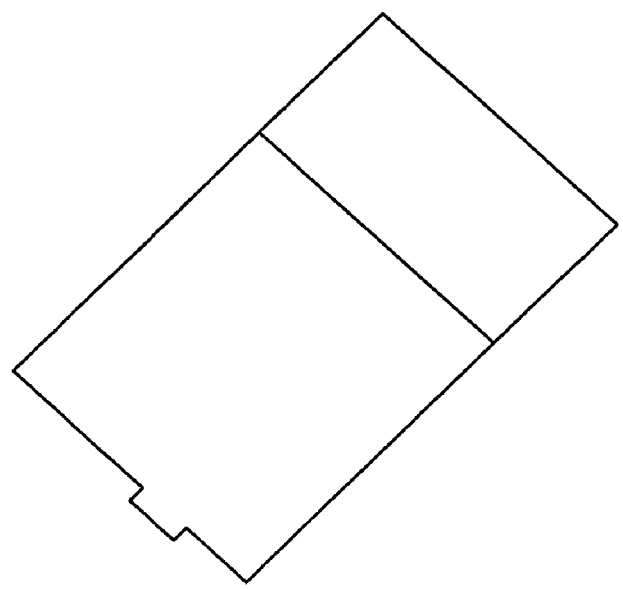
Figure 13F:
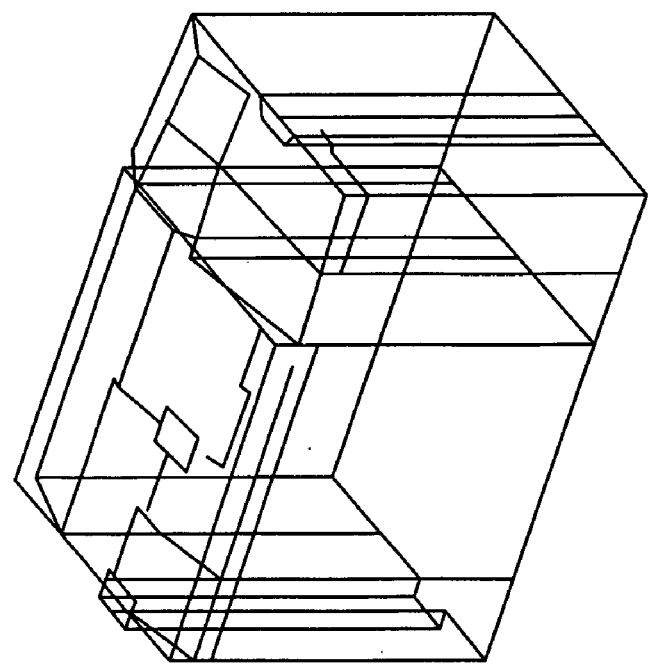
Figure 13H:
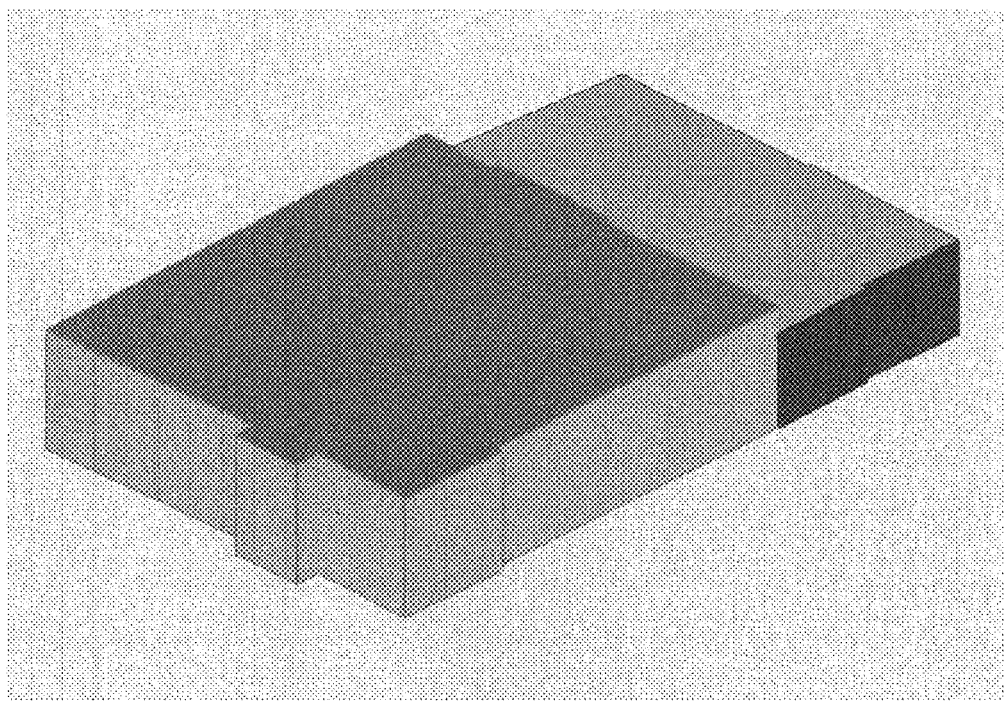

In step 1120, the polyhedral building models can thus be generalized as prismatic building models in a semi-automatic manner. The procedure is described as follows. At beginning, according to the ownership, those roof-primitives that belong to the same owner are manually selected (as shown in FIGS. 13*a* and 13*b*, in 2-D and 3-D view, respectively). They are merged into a single building model (FIG. 13*c*) with flat-roof height. The flat-roof height is automatically estimated. The operator can visually inspect its correctness. If the height is not correct, the operator can manually re-shape its rooftop by selecting the best one among all possible roof heights. The rest part of the polyhedral building models is generalized using the above selection (FIGS. 13*d* and 13*e* in 2-D and 3-D view, respectively), merging (FIG. 13*f*), and shaping procedure. The generated prismatic building models are shown in FIGS. 13*g* and 13*h*, in 2-D and 3-D view, respectively. The number of roof-primitive is now generalized from 12 to 2.

Figure 1:
FIG. 1 shows an aerial stereo-image overlaid with building outline segments that are produced in digital photogrammetric mapping.
Figure 2:
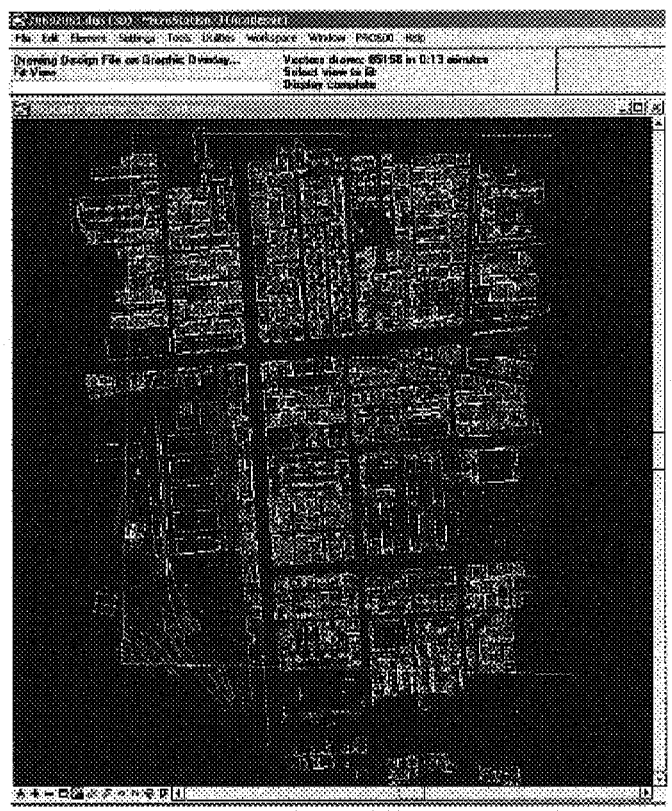
FIG. 2 shows a digital topographic map, which includes buildings and most other ground objects that are manually measured from aerial stereo-images such as the one shown in FIG. 1.
Figure 5:
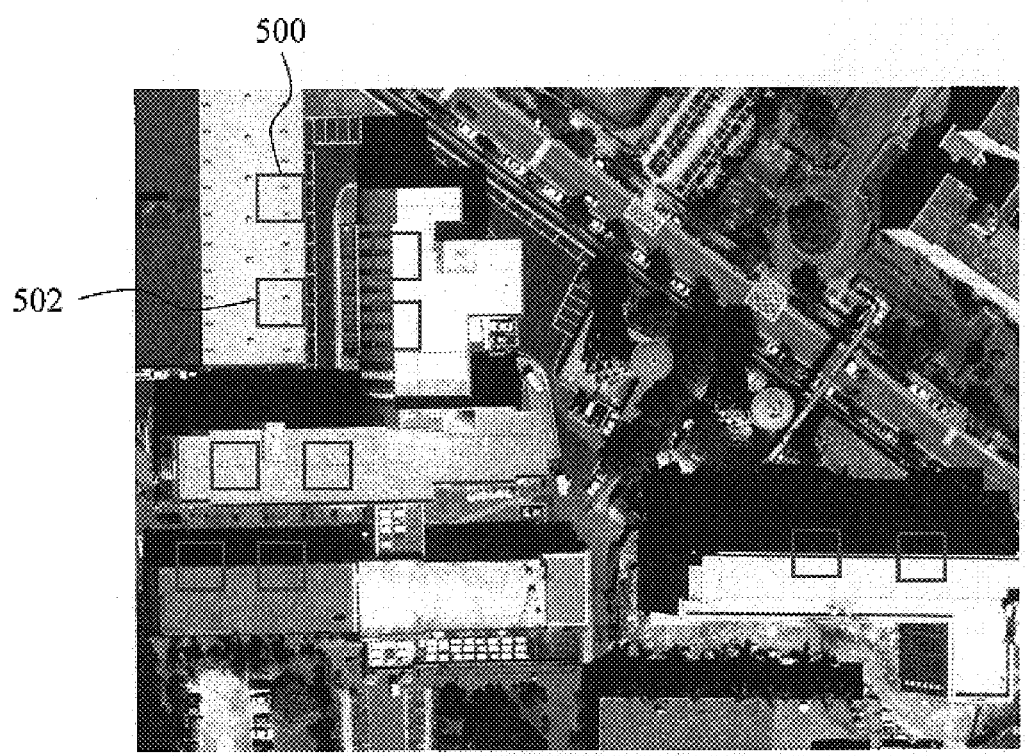
FIG. 5 shows the ambiguity problems in image matching that may occur during a fully automatic approach for building model reconstruction.
Figure 7A:
FIGS. 7a–7c show one of the semi-automatic 3-D building model reconstruction methods published in the literatures.
Figure 7B:
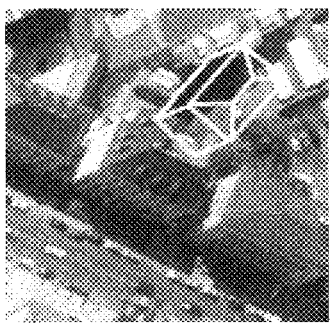
Figure 7C:
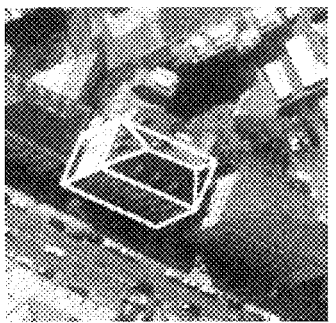
Figure 14:
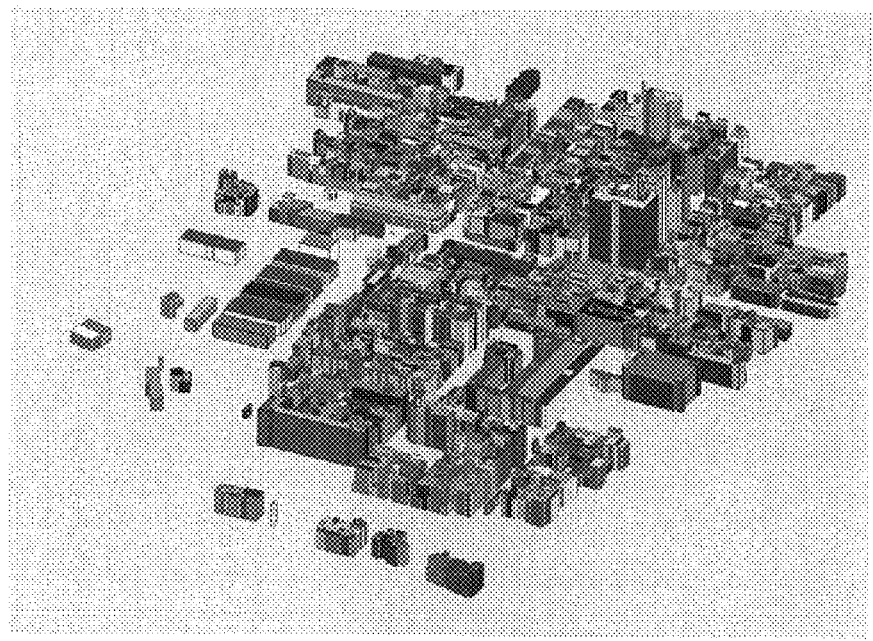
FIG. 14 shows a schematic drawing of the generated 3-D building models using building outline segments that are extracted from a digital topographic map as shown in FIG. 2, according to the present method as shown in FIG. 11, according to the invention.

The present invention can deal with three kinds of data. The first one refers to the manually measured incomplete roof-edges due to building occlusions. One example is demonstrated in FIGS. 12*a* to 12*q* as described above. The second one refers to the building layer in a large-scale digital topographic map (FIG. 2), such as the building outline segments overlaid on the aerial image in FIG. 1. In which the data contents are actually in the form of building outline segments that are mostly edited and completed roof-edges. After applying the invent method for building modeling, the generated polyhedral building models are shown in FIG. 14. The third one refers to a 2-D building outline vector data, together with the number of stories and the terrain height information. When applying the invent SMS method, in the splitting and merging steps for topology reconstruction, the procedures are all the same as that for constructing a polyhedral building model. However, at the shaping step, an approximate flat-roof height can be assigned and derived from the number of stories and the terrain height information.

Figure 15:
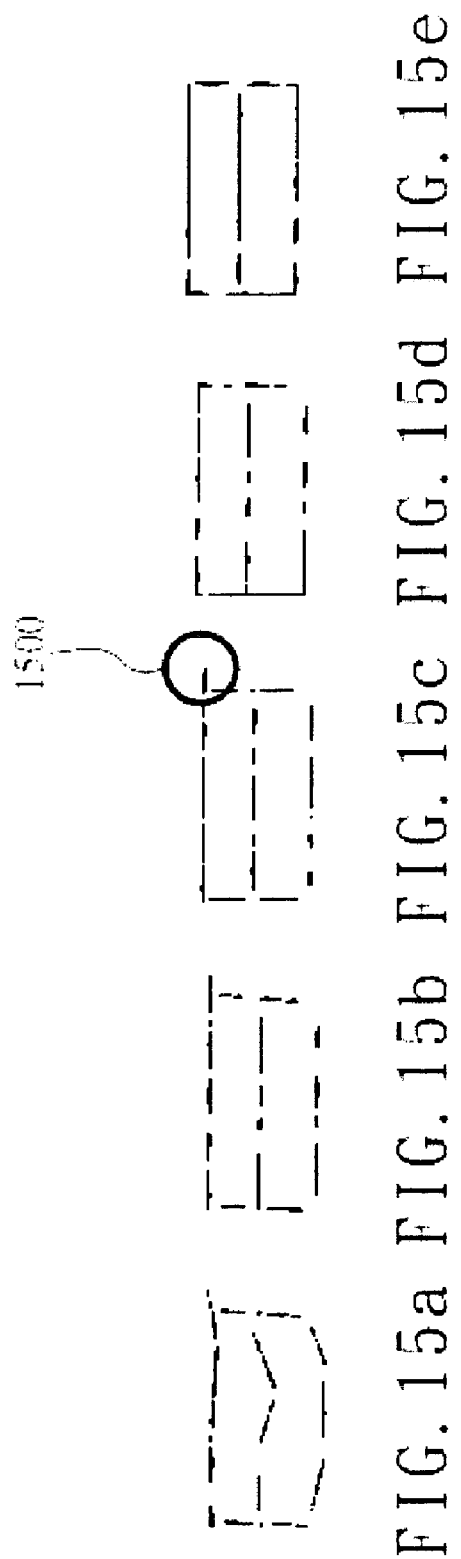
FIGS. 15a–15e show a schematic drawing of the effects of pre-processing, according to the invention.

In step 1104, the effect of the so-called pre-processing is demonstrated in detail as follows. In FIG. 15*a*, it shows a set of simulated building outline segments on a 2-D horizontal plane. The building to be simulated is a rectangular structured gable-roof building For visual effect, the outlines skewness is exaggerated. If such a group of building outlines is directly applied for building modeling, the generated building models will be twisted and deformed. Therefore, the collinear processing is performed to prevent from generating a skewed building model. The result of collinear processing is shown in FIG. 15*b*. Since the building is orthogonal in natural, the orthogonal-structure restoration is necessary. The effect of orthogonal processing is shown in FIG. 15*c*. One can find out a dangle (1500) is hanging out of the building. In case a group of buildings are treated, such a dangle will be dealt with legal building outline and cause illegal building boundary. When applying dangle removal processing, the result is shown in FIG. 15*d*. In which, the roof-edges are fragmented. In case a group of connected and complex buildings are treated, other building's outline segments may split the gaps between two fragmented roof-edges. It may thus produce a roof-primitive that has one boundary without any corresponding building outline segment. Such a roof-primitive will further be merged with other roof-primitives or removed by the rationality check. The results will be erroneous. FIG. 15*e* shows the result after performing the dangle snapping process on FIG. 15*d*.

Embodiment 2

Figure 16:
FIG. 16 illustrates the original aerial-image with delineated visible roof-edges for performance study, according to the invention.
Figure 17:
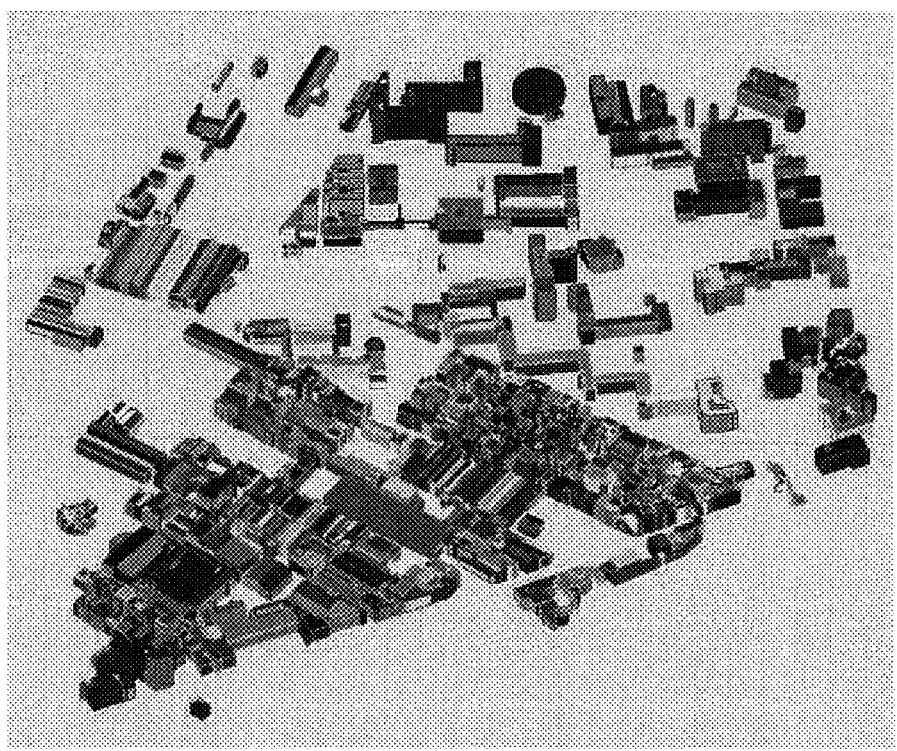
FIG. 17 schematically shows the generated polyhedral building models in performance study, according to the invention.

For a fully performance study about the present invention, a building outline segment data set was measured manually using a digital photogrammetric workstation. The scale of the original aerial stereo-images was 1:5,000 with a 60% overlap. The focal length of the camera was 30.511 cm, and the base-height ratio was approximately 0.3. Digital images were digitized with a scanning resolution of 25 μm. The produced images have a nominal ground sampling distance of 12.5 cm. The content of this test data set can be abstractly categorized into three parts.
  a) Part (I) is a university campus. The buildings are large with complex boundary, and are separated to each other with a distance.
  b) Part (II) is a high-density built-up area with groups of connected and rectangular structured buildings.
  c) Part (III) is a high-density built-up area with groups of connected, complex rooftops, and less-orthogonal buildings FIG. 16 depicts the above three areas on one of the original aerial-photos superimposed by the measured roof-edges. The number of measured roof-edges is 6,363. FIG. 17 depicts the generated polyhedral building models for this data set displayed using a 3-D visualization tool.

Robustness Evaluation

The number of roof-primitives generated using the invent method was 1,809. The splitting and merging process was totally successful after the correction of manual measurement mistakes. However, 38 roof-primitives failed at the shaping stage, giving a success rate of 98%. The 2% failure rate depends on the building complexity and it can be totally recovered at the visual inspection and post-processing stage. These failures occurred mostly in Part (III), where the building's rooftops were complex. An example of this situation has been described previously, i.e. FIGS. 12*n*–12*p*. The performance was totally satisfactory for Part (I) and Part (II), where the buildings were rectangular in structure, although connected, or with complex boundaries. This investigation demonstrated the robustness of the invent method that diversified types of buildings can be modeled using the present invention.

Figure 18:
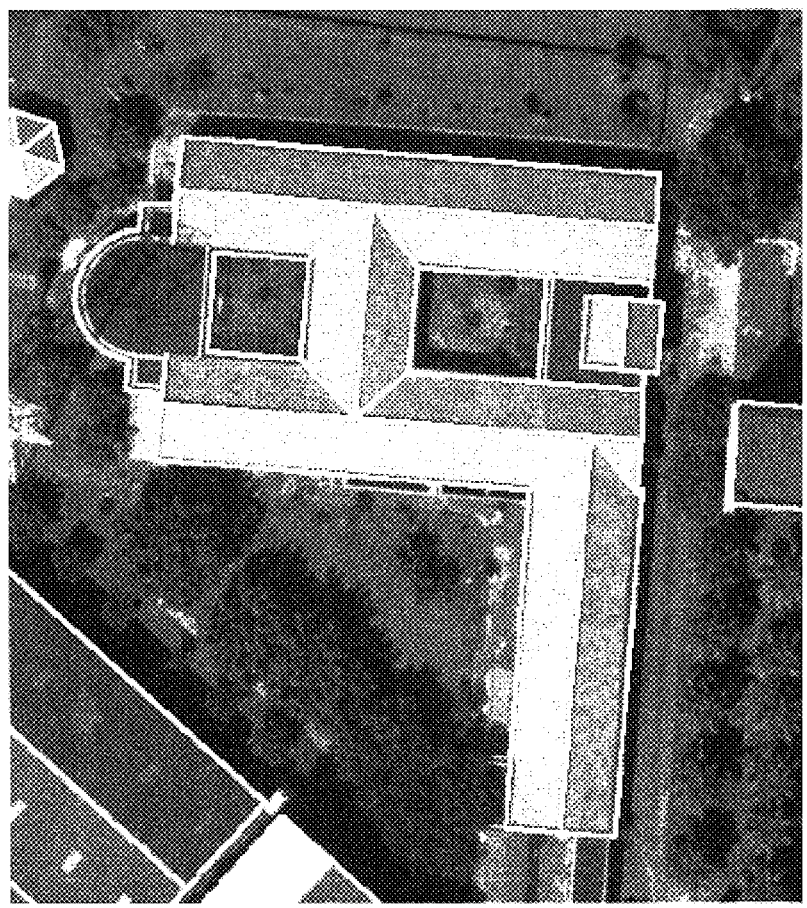
FIG. 18 depicts an aerial image overlaid with the measured building outline segments for detailed examination I, according to the invention.
Figure 19:
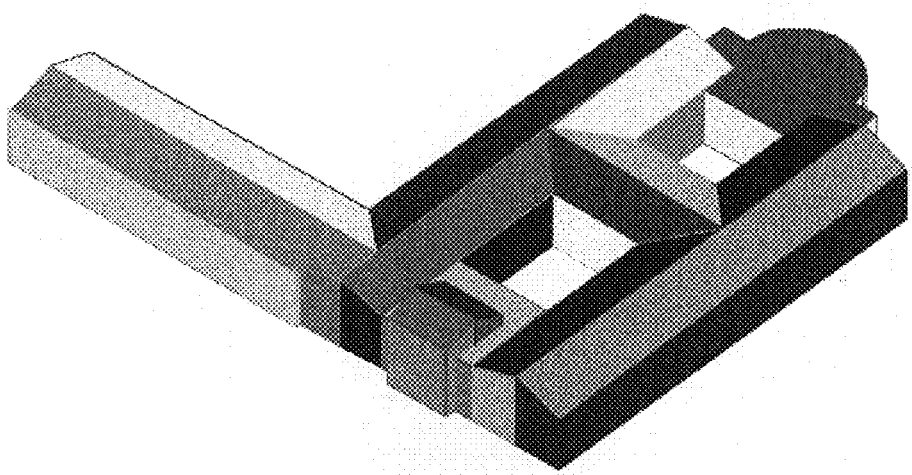
FIG. 19 schematically shows the generated polyhedral building models for detailed examination I, according to the invention.
Figure 20:
FIG. 20 depicts an aerial image overlaid with the measured building outline segments for detailed examination II, according to the invention.
Figure 21:
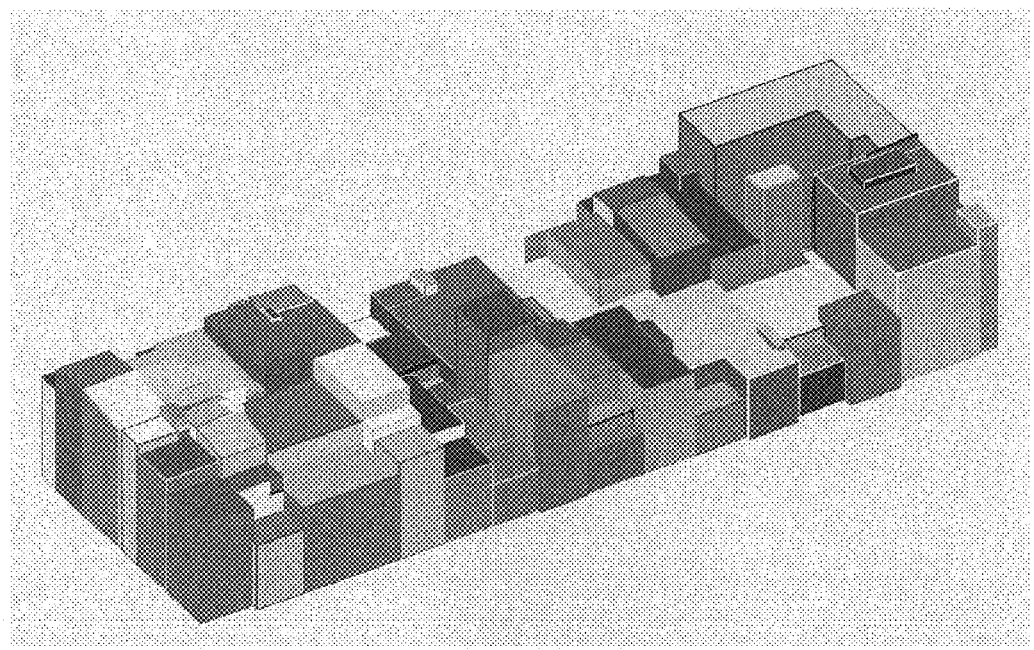
FIG. 21 schematically shows the generated polyhedral building models for detailed examination II, according to the invention.

In order to investigate the robustness in detail, two types of building group are examined The first type is a complex building, the second one a group of connected buildings.
  a) The first type of buildings, depicted in FIG. 18, contains a complex building with a combination of circular and rectangular boundaries. For the circular boundary, a series of consecutive line-segments are measured. The building is a composite of hip-roof, gable-roof, flat-roof and also has two courtyards inside. FIG. 19 demonstrates the reconstructed polyhedral building models displayed using the 3-D visualization tool. The soundness of the invent method is quite obvious
  b) The second type of building, shown in FIG. 20, contains a group of connected and mixed rooftop types. The hidden effects are problematic for manual measuring and building modeling. By applying the invent method, the results depicted in FIG. 21 are encouraging. Again, the invent method is proven to be robust for the second type of buildings, where image occlusions frequently happen.

Efficiency Estimation

The estimation of the processing time was based on the use of a personal computer with an AMD Athlon 1.2 GHz CPU. The global performance test uses the whole data set with a total of 6,363 line-segments Each group of connected buildings is processed each time. The total processing time, which includes automatic modeling and human inspection, was less than two hours, of which, only five percent was required for automatic building modeling.

Figure 22:
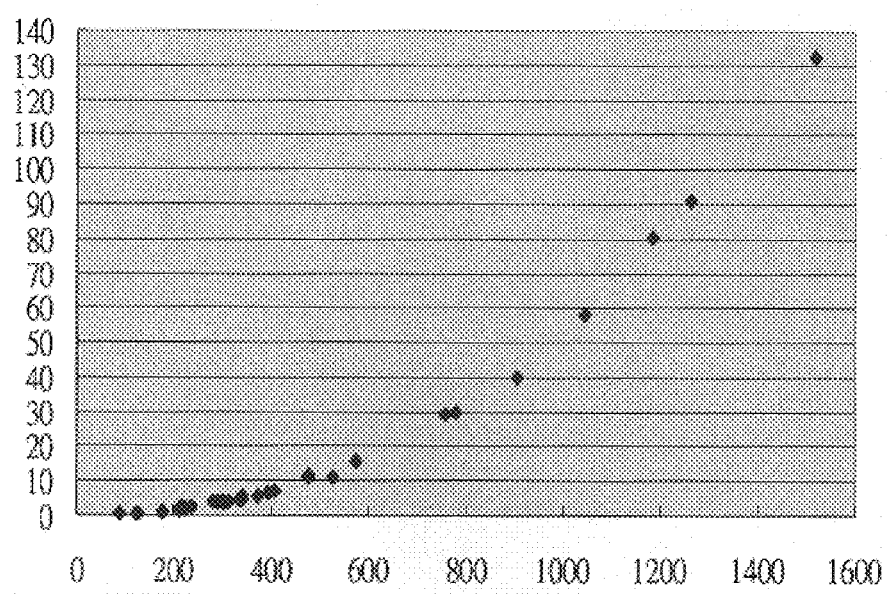
FIG. 22 is a diagram depicting the processing time verse the number of line-segments used, according to the invention.

The processing time depends on building complexity and the number of line-segments used. As shown in FIG. 22, the processing time verse the number of line-segments is depicted. In general, for a group of buildings with less than 400 line-segments, the processing time for modeling was less than 10 seconds. For example, in detailed examination II, as shown in FIG. 20, the number of building outline segments is 209, which generates 69 roof-primitives at last. The total amount of processing time, including pre-processing and the Split-Merge-Shape processes, was only 1.49 seconds. As the response time is quite short, an interactive system is possible.

Accuracy Evaluation

Figure 23A:
FIGS. 23a–23b illustrates two examples of measured part-of roof-edges for accuracy evaluation, according to the invention.
Figure 23B:
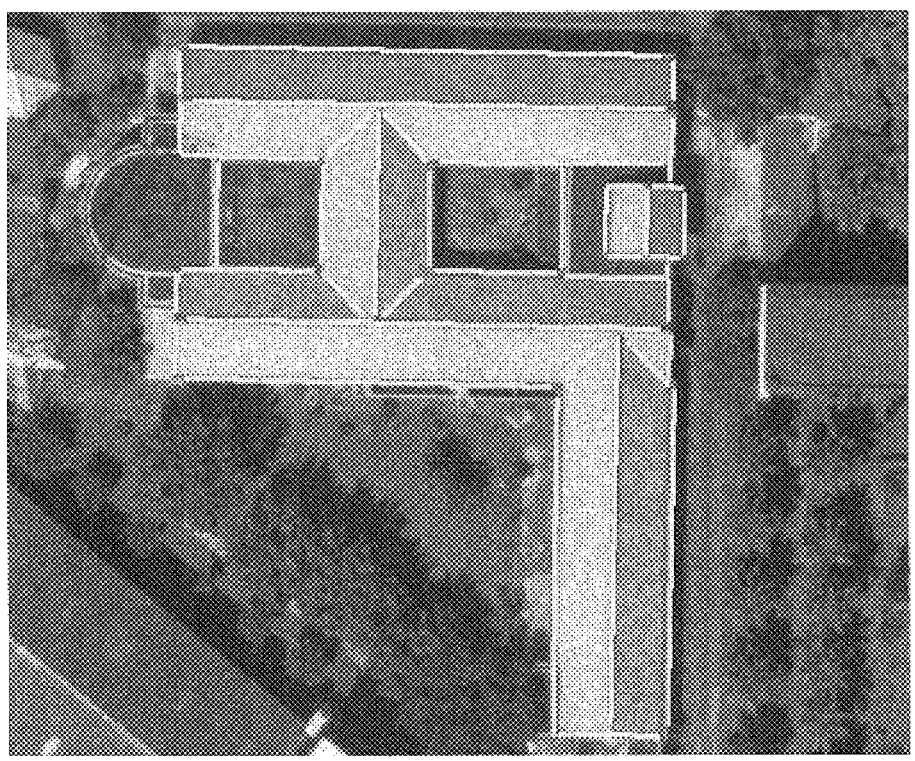

The accuracy of the generated building models mostly depends on the accuracy of the manual measurements The estimated locations of hidden corners were less accurate than the direct measurement of visible ones. In order to evaluate the modeling error, we considered the manual measurements of visible corners as hidden ones, so evaluations can be performed accordingly. We measured the parts-of roof-edges that make the totally visible roof-edges incomplete. Two examples are illustrated in FIGS. 23*a*–23*b*, in which the measured part-of roof-edges are superimposed. One finds that the visible corners are not measured on purpose, and the rooftop includes both oblique and flat. After applying the present invention for building modeling, those visible corners are then manually measured for accuracy evaluation. The total number of visible corners for evaluation is 163, it achieves a MEAN error of 1.06 cm, 1.22 cm, and 2.73 cm on the X, Y and Z-axis, respectively. In the mean time, a Root-Mean-Square Error (RMSE) of 13.5 cm, 14.5 cm, and 34.9 cm on the X, Y and Z-axis, respectively, is achieved. Since the original stereo-pair has a nominal ground sampling distance of 12.5 cm and a base-height-ratio of 0.3, the RMSE is close to be one pixel on the image scale, which falls into the range of random errors.

SUMMARY

In summary, the present invention for geometrical building modeling that uses manually measured visible roof-edge is innovative. The method has proven robust and efficient. The success rate is high, even in a complex environment. The operator's workload as well as the cost is reduced, due to partially occluded roof-edges are utilized. The present invention has the following advantages 1. The present invention is based on a semi-automatic approach. Although the data collection is totally manual here but only the visible roof-edges need to be measured and the digitizing sequence is free, thus the operating procedure is simplified and the operator's workload is minimized.

2. In the modeling phase, the topology reconstruction is fully automatic not needing human intervention. For extremely complex buildings, when the building outline segments are insufficient to delineate the shape of their rooftops, the consecutive-coplanar analysis provides all possible solution in the visual inspection and post-processing stage to complete the modeling.

3. The present invention is a bottom-up approach, but no building model database is required, which means that there is no limitation of building types, only if the rooftops can be described as a combination of planar facets.

4. The invent method is robust and flexible even complex buildings or a group of connected buildings are treated, which dramatically reduces the operator's workload. This is especially important for densely built-up areas that the manual editing of building connections problems can be avoided.

5. By means of the invent technology, the integration of photogrammetric mapping with 3-D building modeling in one procedure is possible, which is the most cost-effective approach for 3-D mapping.

6. A digital topographic map of buildings can be directly and efficiently converted to be 3-D city models without any additional manual editing or modification of the original measurements. This feature is important for those areas already have large-scale digital topographic maps with building outlines layer. The invent method is also applicable to a 2-D building outline vector data, together with the number of stories and the terrain height information.

7. The invent method can be applied for generating polyhedral and prismatic building models. It thus can fulfill the requirements of most 3-D spatial data analysis and 3-D visualization applications.

8. The invent method is not sensitive to the scale of aerial images and the degree of generalization in manual measurements, provided that the roof-edge delineations can be recognized as a meaningful building.

What is claimed is:

1. A method for semi-automatically reconstructing 3-D building models, comprising:

using a plurality of building outline segments to construct a plurality of closed polygonal building boundaries, wherein the neighboring building outline segments are either connected or disconnected;

creating an initial building model;

performing a pre-processing process on the building outline segments;

successively splitting the initial building model by the building outline segments to generate a plurality of the 3-D building models;

removing the 3-D building models that are connected to the initial building model;

successively analyzing shared boundaries of the two connected 3-D building models whether or not having a corresponding one of the building outline segments;

if no corresponding building outline segment exists, then merging the two building models into one single building model;

if one corresponding building outline segment exists, then keeping the two building models as the 3-D building models;

assigning a height to every one of the building's boundaries according to a height of the corresponding one of the building outline segments; and successively analyzing whether each of the building model's boundaries is an independent-edge or a shared-edge, wherein the independent-edge means that it does not overlapped with the other building model's boundaries on a 2-D horizontal plane, and the height information for the independent-edge can then be assigned and fixed from the corresponding one of the building outline segments, wherein if only one of the independent-edges is found, it is necessary to check whether its surrounding rooftop is fixed or not; wherein if all of its surrounding rooftop have already been fixed, then its rooftop can be inferred from the independent-edge; and if at least two of the independent-edges exist and are sufficient to fit into a planar face, then a least-squares coplanar fitting can be applied, otherwise, a most possible solution is provided by a consecutive-coplanar analysis.

2. The method according to claim 1, wherein the method further comprises acquiring a plurality of stereo images of the building model from different positions to perform the reconstruction of the building models, wherein the building outline segments are obtained by a stereo-measurement from roof edges of the building model.

3. The method according to claim 1, wherein the building outline segments includes three kinds of data, which are (i) a building layer of a digital topographic map in a form of the building outline segments, (ii) partial-occluded the building outline segments, and (iii) a 2-D building outline vector together with a number of stories and a terrain height information.

4. The method according to claim 1, wherein when dealing with ground objects that have a character of closed polygon, the method can integrate the digital photogrammnetric mapping wit the 3-D building model reconstruction to reduce a task of manual editing and manual modeling.

5. The method according to claim 1, wherein when a 2-D building outline vector together with a number of stories and a terrain height information are utilized, a height of a flat-roof can be derived from the number of stories and the terrain height.

6. The method according to claim 1, wherein the pre-processing comprises:
   performing collinear processing, dangle removal, or dangle snapping when the building's structure is not rectangular; and
   performing orthogonal processing, collinear processing, dangle removal, or dangle snapping when the building's structure is rectangular.

7. The method according to claim 1, further comprising performing a visual inspection and post-processing, which comprises:
   inspecting whether each of the 3-D building models is fit with the corresponding the building outline segments and consistent with the building in original aerial stereo-images;
   if topology errors occurred due to manual measurement mistakes, an operator returning to the manual stereo-measurement stage to correct these mistakes and redo the modeling procedure;
   if topology errors occurred due to stereo-measurement errors, the operator applying a suitable pre-processing procedure to automatically adjust the building outline segments and redo the modeling procedure;
   if shaping errors occurred due to non-coplanarity of the roof-edges measurements, the operator choosing the best-fit rooftop provided by the consecutive-coplanar analysis; and
   if a topology and a roof shape are all right, keeping the building models and forming a polyhedral building model.

8. The method according to claim 1, further comprising a semi-automatic method for producing a prismatic building model:
   according to an ownership information, interactively selecting the 3-D building models that belong to a same owner;
   merging the selected 3-D building models into a single building model automatically-, and
   giving a flat roof and an actual height to form the prismatic building model automatically.

9. The method according to claim 8, further comprising a visual inspection procedure, which comprises
   inspecting whether the actual height of the generated prismatic building model is correct;
   if not, interactively choosing a correct one from all possible one of the roof heights provided by heights of a polyhedral building model; and
   if yes, forming the prismatic building model.

* * * * *